(12) United States Patent
Igarashi et al.

(10) Patent No.: US 9,160,281 B2
(45) Date of Patent: Oct. 13, 2015

(54) SEMICONDUCTOR INTEGRATED CIRCUIT AND RADIO COMMUNICATION TERMINAL INCLUDING THE SAME

(71) Applicant: Renesas Mobile Corporation, Tokyo (JP)

(72) Inventors: Yutaka Igarashi, Yokohama (JP); Yusaku Katsube, Yokohama (JP)

(73) Assignee: Renesas Electronics Corporation, Tokyo (JP)

( * ) Notice: Subject to any disclaimer, the term of this patent is extended or adjusted under 35 U.S.C. 154(b) by 109 days.

(21) Appl. No.: 13/931,894

(22) Filed: Jun. 29, 2013

(65) Prior Publication Data

US 2014/0043099 A1    Feb. 13, 2014

(30) Foreign Application Priority Data

Aug. 8, 2012  (JP) ................. 2012-175780

(51) Int. Cl.
*H03F 1/36* (2006.01)
*H03F 1/34* (2006.01)
(Continued)

(52) U.S. Cl.
CPC .............. *H03F 1/34* (2013.01); *H03F 3/45475* (2013.01); *H03G 1/0088* (2013.01); *H03F 2203/45528* (2013.01); *H03F 2203/45591* (2013.01); *H03F 2203/45594* (2013.01); *H03F 2203/45616* (2013.01)

(58) Field of Classification Search
CPC ..... H03F 1/34; H03F 3/45475; H03F 1/3211; H03F 2203/45528; H03F 3/187; H03F 2203/45594; H03F 2200/141; H03F 2200/144; H03F 2200/211
USPC ..................... 330/86, 144, 282, 307
See application file for complete search history.

(56) References Cited

U.S. PATENT DOCUMENTS 4,855,685 A * 8/1989 Hochschild .................... 330/282
7,679,447 B2 * 3/2010 Oishi ............................ 330/284
(Continued)

FOREIGN PATENT DOCUMENTS

JP   2005-323131 A   11/2005
JP   2008-205560 A    9/2008
JP   2011-502422 A    1/2011

OTHER PUBLICATIONS

Nguyen, H.-H. et al, "84dB 5.2 mA digitally-controlled variable gain amplifier", Electronics Letters, 2008, vol. 44, No. 5, pp. 344-345.
(Continued)

*Primary Examiner* — Khanh V Nguyen
(74) *Attorney, Agent, or Firm* — Miles & Stockbridge P.C.

(57) ABSTRACT

A semiconductor integrated circuit includes an operational amplifier that amplifies a voltage difference between an input voltage supplied to an inverting input terminal and a reference voltage supplied to a non-inverting input terminal and outputs an amplified signal, a feedback resistor that performs negative feedback of the amplified signal to the inverting input terminal of the operational amplifier, and a variable resistor unit that sets a current path with a first resistance value in accordance with a control signal between an external input terminal and the inverting input terminal of the operational amplifier, and sets a first alternative path with a second resistance value in accordance with the control signal between a node on the current path and a reference voltage terminal to which the reference voltage is supplied.

19 Claims, 24 Drawing Sheets

(51) Int. Cl.
*H03G 1/00* (2006.01)
*H03F 3/45* (2006.01)

(56) References Cited

U.S. PATENT DOCUMENTS

| | | | |
|---|---|---|---|
| 8,884,693 B2* | 11/2014 | Lee | 330/86 |
| 2006/0176110 A1 | 8/2006 | Kwon | |
| 2006/0197592 A1 | 9/2006 | Chang | |
| 2008/0197924 A1 | 8/2008 | Oishi | |
| 2009/0109950 A1 | 4/2009 | Richardson et al. | |
| 2013/0154740 A1* | 6/2013 | Xie | 330/260 |
| 2013/0293305 A1* | 11/2013 | Lee | 330/260 |

OTHER PUBLICATIONS

Parssinen, Aarno, "Direct Conversion Receivers in Wide-Band Systems", Kluwer Academic Publishers, pp. 76-103.

Japanese Office Action for related application JP 2012-175780, mailed Aug. 25, 2015.

* cited by examiner

| STATE | ATTENUATION | S11T,B | S12T,B | S13T,B | S21T,B | S22T,B | S23T,B | S14T,B |
|---|---|---|---|---|---|---|---|---|
| A | 0dB | 1-2 | 1-2 | 1-2 | open | open | open | short |
| B | -6dB | 1-3 | 1-2 | 1-2 | short | open | open | short |
| C | -12dB | 1-3 | 1-3 | 1-2 | short | short | open | short |
| D | -18dB | 1-3 | 1-3 | 1-3 | short | short | short | short |

Fig. 5

| STATE | ATTENUATION | S31T,B | S32T,B | S33T,B | S34T,B | S41T,B | S42T,B | S43T,B |
|---|---|---|---|---|---|---|---|---|
| A | 0dB | short | open | open | open | open | open | open |
| B | -6dB | open | short | open | open | short | open | open |
| C | -12dB | open | open | short | open | short | short | open |
| D | -18dB | open | open | open | short | short | short | short |

Fig. 10

|        | S201T, B | S202T, B | S203T, B | S204T, B |
|--------|----------|----------|----------|----------|
| 0dB    | short    | open     | open     | open     |
| -6dB   | open     | short    | open     | open     |
| -12dB  | open     | open     | short    | open     |
| -18dB  | open     | open     | open     | short    |

Fig. 24

SEMICONDUCTOR INTEGRATED CIRCUIT AND RADIO COMMUNICATION TERMINAL INCLUDING THE SAME

CROSS-REFERENCE TO RELATED APPLICATIONS

This application is based upon and claims the benefit of priority from Japanese patent application No. 2012-175780, filed on Aug. 8, 2012, the disclosure of which is incorporated herein in its entirety by reference.

BACKGROUND

The present invention relates to a semiconductor integrated circuit and a radio communication terminal including the same.

Typically, an amplification circuit having a function as a filter is provided in a radio communication terminal. For example, H.-H. Nguyen et al, "84 dB 5.2 mA digitally-controlled variable gain amplifier", Electronics Letters, 2008, Vol. 44, No. 5, pp. 344-345 discloses a device including an amplification circuit.

SUMMARY

The present inventors have found various problems in the development of semiconductor integrated circuits used in radio communication terminals or the like. Each embodiment disclosed in this specification provides a semiconductor integrated circuit suitable for a radio communication terminal, for example. More detailed features will be made clear from the description of the specification and the accompanying drawings.

One aspect disclosed in this specification includes a semiconductor integrated circuit, and the semiconductor integrated circuit includes a variable resistor unit that sets a current path and an alternative path in accordance with a control signal.

According to the above aspect, it is possible to provide a semiconductor integrated circuit with high quality and a radio communication terminal including the same.

BRIEF DESCRIPTION OF THE DRAWINGS

The above and other aspects, advantages and features will be more apparent from the following description of certain embodiments taken in conjunction with the accompanying drawings, in which:

FIG. 5 is a diagram showing a relationship between the conducting state of a plurality of switching elements provided in the programmable voltage-to-current converter PVIC1 and the voltage gain of the inverting amplification circuit according to the first embodiment;

FIG. 10 is a diagram showing a relationship between the conducting state of a plurality of switching elements provided in a programmable voltage-to-current converter PVIC2 and the voltage gain of an inverting amplification circuit according to the second embodiment;

FIG. 24 is a diagram showing a relationship between the conducting state of a plurality of switching elements provided in a programmable voltage-to-current converter PVIC20 and the voltage gain of an inverting amplification circuit.

DETAILED DESCRIPTION

<Previous Studies by the Inventors>

Figure 1A:
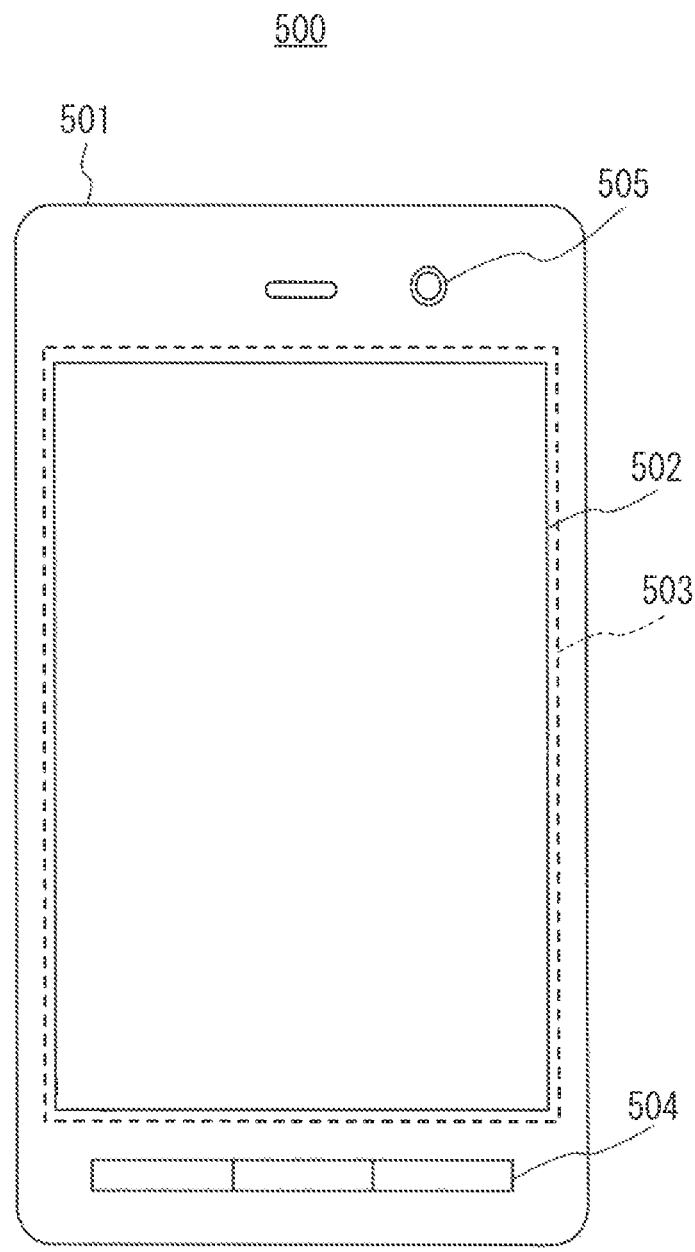
FIG. 1A is an external view showing one example of a radio communication terminal according to a first embodiment.

Before describing embodiments of the present invention, previous studies conducted by the present inventors will be described.

Conventionally, in a radio signal processing circuit mounted on a radio communication terminal or the like, each of a plurality of functional blocks (an amplifier that amplifies signals, a mixer that converts frequencies of signals, filter that passes only a signal in a desired band etc.) has been provided as a separate component. However, recent improvement in semiconductor techniques has made it possible to incorporate many of the plurality of functional blocks forming the radio signal processing circuit into one semiconductor chip. Further, a radio signal processing circuit that is compatible with a plurality of radio access systems has been widely used in the field of mobile telephones, for example. Such a radio signal processing circuit incorporated into one or a plurality of semiconductor chips converts high-frequency signals received from an antenna into signals with high quality (low noise, high linearity, suppressing signals in bands other than a desired band) and having lower frequency bands.

In order to achieve the radio signal processing circuit with low cost, it is required to incorporate many of the plurality of functional blocks forming the radio signal processing circuit into one semiconductor chip. One difficulty in achieving this purpose is to incorporate a filter circuit that suppresses signals in bands other than a desired band into a semiconductor chip. Typically, this filter circuit is formed using a SAW (Surface Acoustic Wave) filter, a dielectric filter or the like, and suppresses signals that exist in bands other than the desired band. However, the SAW filter or the dielectric filter cannot be incorporated into the semiconductor chip because of its configurations.

The radio signal processing circuit made up of separate components is typically formed in a super heterodyne system, and requires the SAW filter or the dielectric filter. However, they cannot be incorporated into the semiconductor chip. Accordingly, when the radio signal processing circuit produced using semiconductors is formed in a super heterodyne system, the SAW filter or the dielectric filter are attached to the external part of the semiconductor chip. This causes an increase in the number of components and an increase in the mounting area.

In order to solve these problems, a radio signal processing circuit system which does not require the SAW filter or the dielectric filter has been newly proposed, taking advantage of the semiconductor circuit that, while absolute values of component constants among semiconductor chips vary, relative values of the component constants in one semiconductor chip accord with each other with high accuracy. This system includes a zero-IF system and a low-IF system, for example. Both systems do not require the external SAW filter or dielectric filter, and suppression of signals that exist in bands other than the desired band is made by a filter that can be incorporated into a semiconductor. However, it may be required that a part of the filter is externally attached depending on the radio systems or system requirements.

See, for example, Aarno Parssinen, "DIRECT CONVERSION RECEIVERS IN WIDE-BAND SYSTEMS", Kluwer Academic Publishers, pp. 76-103 for the basic principles of the zero-IF system or the low-IF system. The zero-IF system and the low-IF system have a common operational characteristic that one signal is decomposed into two components of an I component and a Q component for processing. The two local oscillator signals having the same frequency and phases different by 90 degrees and the radio signal received by the antenna or the like are input to an orthogonal mixer, whereby the radio signal received by the antenna or the like is decomposed into the I component and the Q component.

Note that the radio signal processing circuit at least includes, in the subsequent stage of the above-described orthogonal mixer, an amplification circuit that amplifies an output result of the orthogonal mixer, an attenuator that causes the amplification circuit to operate within the linear operation range by attenuating the output signal of the amplification circuit, and a channel filter that allows only a desired channel bandwidth to pass through.

Figure 22:
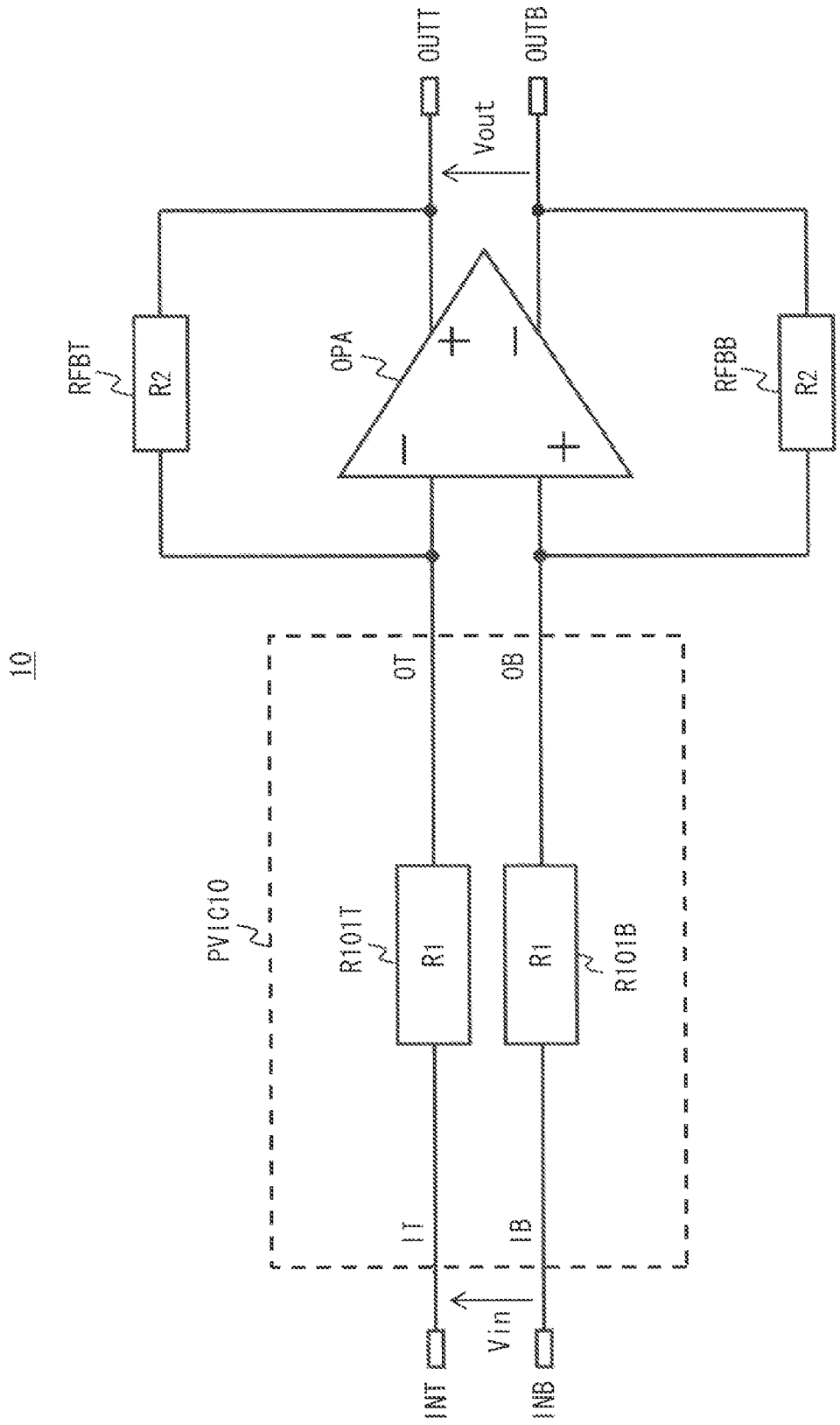
FIG. 22 is a diagram showing a configuration example of an inverting amplification circuit 10 according to the concept before reaching the embodiment.
Figure 23:
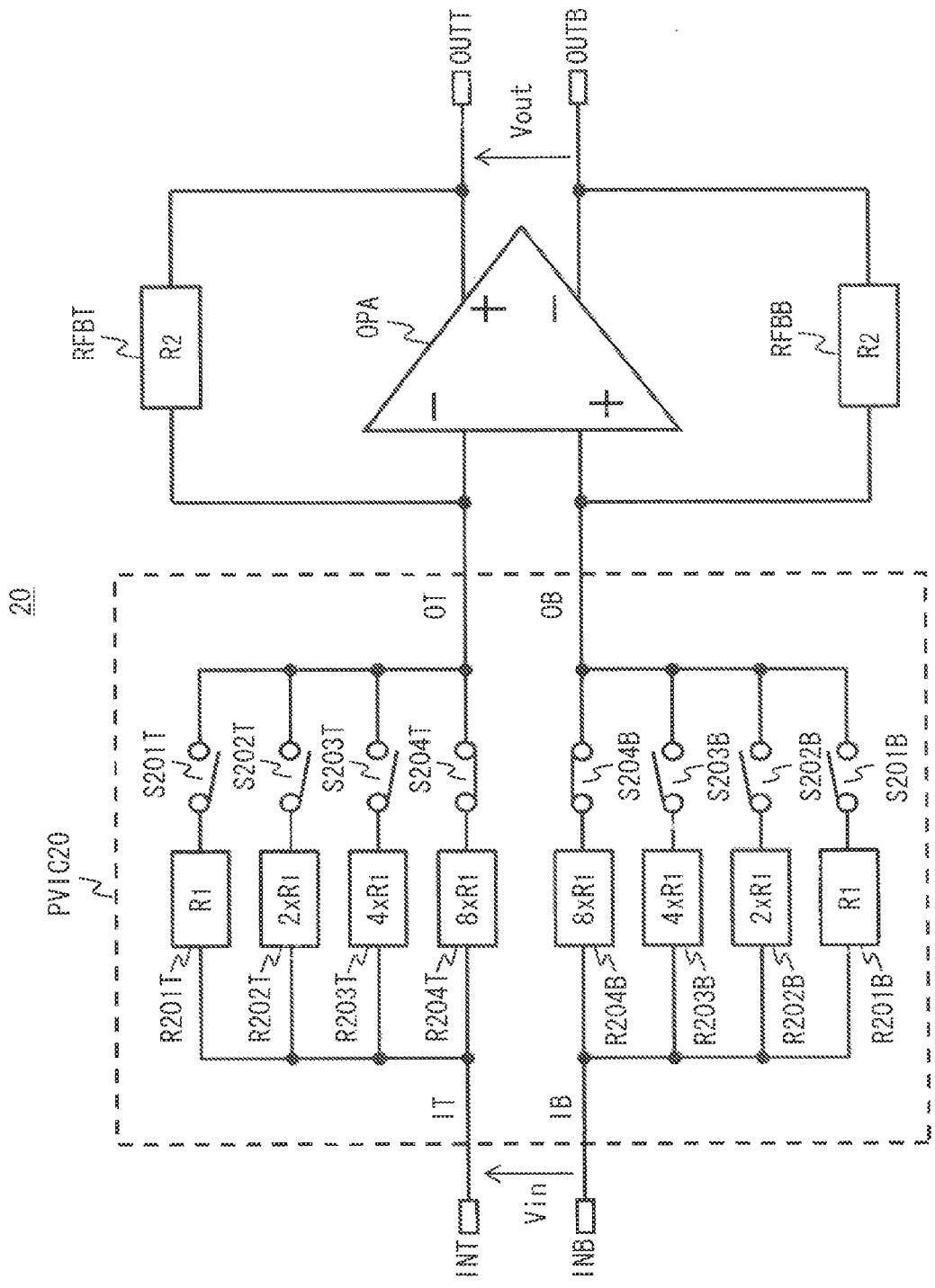
FIG. 23 is a diagram showing a configuration example of an inverting amplification circuit 20 according to the concept before reaching the embodiment.

Based on such semiconductor techniques, the present inventors have studied the circuits shown in FIGS. 22 and 23. FIG. 22 is a diagram showing a configuration example of an inverting amplification circuit (semiconductor integrated circuit) 10 according to the concept before reaching the embodiment. FIG. 23 is a diagram showing a configuration example of an inverting amplification circuit (semiconductor integrated circuit) 20 according to the concept before reaching the embodiment. The inverting amplification circuits 10 and 20 are used as a part of the radio signal processing circuit.

<Inverting Amplification Circuit 10 According to the Concept Before Reaching the Embodiment>

The inverting amplification circuit 10 shown in FIG. 22 is described firstly. The inverting amplification circuit 10 is a circuit that amplifies an output result Vin of a mixer (not shown) supplied to input terminals INT and INB and outputs an amplification result Vout from output terminals OUTT and OUTB.

The inverting amplification circuit 10 shown in FIG. 22 includes an operational amplifier (amplification circuit) OPA, feedback resistors RFBT and RFBB, and a voltage-to-current converter PVIC10.

Input terminals IT and IB of the voltage-to-current converter PVIC10 are respectively connected to input terminals INT and INB of the inverting amplification circuit 10. Output terminals OT and OB of the voltage-to-current converter PVIC10 are respectively connected to an inverting input terminal and a non-inverting input terminal of the operational amplifier OPA. A non-inverting output terminal and an inverting output terminal of the operational amplifier OPA are respectively connected to output terminals OUTT and OUTB of the inverting amplification circuit 10. The feedback resistor RFBT is placed between the non-inverting output terminal and the inverting input terminal of the operational amplifier OPA. The feedback resistor RFBB is placed between the inverting output terminal and the non-inverting input terminal of the operational amplifier OPA.

The voltage-to-current converter PVIC10 includes resistor elements R101T and R101B. In the voltage-to-current converter PVIC10, the resistor element R101T is placed between the input terminal IT and the output terminal OT. The resistor element R101B is placed between the input terminal 1B and the output terminal OB.

Note that, in the following example, the case where the resistance of each of the resistor elements R101T and R101B is $R_1$ is described.

The derailed operation of the inverting amplification circuit 10 shown in FIG. 22 is described next.

The output terminals OT and OB of the voltage-to-current converter PVIC10 are respectively connected to the inverting input terminal and the non-inverting input terminal of the operational amplifier OPA with negative feedback by the feedback resistors RFBT and RFBB. Thus, the output terminals OT and OB of the voltage-to-current converter PVIC10 are at the same potential.

An output current Iin10 of the voltage-to-current converter PVIC10 is represented by the following equation (1) when the current flowing from the voltage-to-current converter PVIC10 to the operational amplifier OPA is a positive current.

$$Iin10 = I_{OT} - I_{OB} = (V_{INT} - V_{INB})/R_1 \quad \text{Equation (1)}$$

Note that $I_{OT}$ and $I_{OB}$ indicate the current flowing to the output terminals OT and OB of the voltage-to-current converter PVIC10, respectively. $V_{INT}$ and $V_{INB}$ indicate the potential of the input terminals INT and INB of the inverting amplification circuit 10, respectively.

The current Iin10 is converted into a voltage by the feedback resistors RFBT and RFBB and then output from the output terminals OUTT and OUTB. Thus, a voltage gain G10 of the inverting amplification circuit 10 including the voltage-to-current converter PVIC10 is represented by the following equation (2).

$$\begin{aligned} G10 &= (V_{OUTT} - V_{OUTB})/(V_{INT} - V_{INB}) \quad \text{Equation (2)} \\ &= -Iin10 \times R_2/(V_{INT} - V_{INB}) \\ &= -R_2/R_1 \end{aligned}$$

Note that $V_{OUTT}$ and $V_{OUTB}$ indicate the potential of the output terminals OUTT and OUTB, respectively.

<Inverting Amplification Circuit 20 According to the Concept Before Reaching the Embodiment>

The inverting amplification circuit 20 shown in FIG. 23 described next. The inverting amplification circuit 20 is different from the inverting amplification circuit 10 shown in FIG. 22 in that it includes a programmable voltage-to-current converter (variable resistor unit) PVIC20 in place of the voltage-to-current converter PVIC10. The other circuit configuration and operation of the inverting amplification circuit 20 are the same as those of the inverting amplification circuit 10 and the description thereof is omitted.

The programmable voltage-to-current converter PVIC20 controls the voltage gain of the inverting amplification circuit 20 in a programmable manner. For example, the programmable voltage-to-current converter PVIC20 attenuates an amplification result Vout of the inverting amplification circuit 20 in a programmable manner and thereby allows the inverting amplification circuit 20 to operate within the linear operation range.

The programmable voltage-to-current converter PVIC20 includes resistor elements R201T to R204T and R201B to R204B, and switching elements S201T to 3204T and S201B to S204B.

In the programmable voltage-to-current converter PVIC20, the resistor elements R201T to R204T are placed in parallel between the input terminal IT and the output terminal OT. The switching elements S201T to S204T are connected in series to the resistor elements R201T to R204T, respectively. The resistor elements R201B to R204B are placed in parallel between the input terminal TB and the output terminal OB. The switching elements S201B to S204B are connected in series to the resistor elements R201B to R204B, respectively.

Note that, in the following example, the case where the resistance of each of the resistor elements R201T and R201B is $R_1$, the resistance of each of the resistor elements R202T and R202B is $2R_1$, the resistance of each of the resistor elements R203T and R203B is $4R_1$, and the resistance of each of the resistor elements R204T and R204B is $8R_1$ is described.

The programmable voltage-to-current converter PVIC20 controls the conducting state of each of the switching elements S201T to S204T and S201B to S204B based on a control signal from a control circuit (not shown) and thereby controls the combined resistance between the input terminal IT and the output terminal OT and the combined resistance between the input terminal IB and the output terminal OB in a programmable manner. The inverting amplification circuit 20 can thereby amplify the input voltage Vin with a desired voltage gain and output the amplification result Vout. Consequently, the inverting amplification circuit 20 can attenuate the amplification result Vout and operates within the linear operation range, for example.

The derailed operation of the inverting amplification circuit 20 shown in FIG. 23 is described hereinbelow.

The switching elements S201T to S204T and S201B to S204B are formed using FET (Field Effect Transistor) such as MOSFET (Metal-Oxide Semiconductor Field Effect Transistor) or JFET (Junction Field Effect Transistor), for example. Thus, the on-resistance of each of the switching elements S201T to S204T and S201B to S204B is preferably adjusted to satisfy the following equation (3). The effects of element variations, temperature characteristics and the like are thereby reduced.

$$RS204 = 2 \times RS203 = 4 \times RS202 = 8 \times RS201 \quad \text{Equation (3)}$$

Note that RS201 to RS204 indicate the on-resistance of the switching elements S201T to S204T and also indicate the on-resistance of the switching elements S201B to S204B, respectively.

FIG. 24 is a diagram showing a relationship between the conducting state of a plurality of switching elements provided in the programmable voltage-to-current converter PVIC20 and the voltage gain of the inverting amplification circuit 20.

When the switching elements S201T and S2013 are on (short) and the other switching elements are off (open), a voltage-to-current conversion gain gm20 of the programmable voltage-to-current converter PVIC20 is $1/R_1$, which is the same as a voltage-to-current conversion gain gm10 of the programmable voltage-to-current converter PVIC10 shown in FIG. 22. Further, a voltage gain G20 of the inverting amplification circuit 20 in this case is $20 \times \log 10(|G20|)$dB, which is the same as a voltage gain G10 of the inverting amplification circuit 10.

When the switching elements S202T and S202B are on (short) and the other switching elements are off (open), the voltage-to-current conversion gain gm20 of the programmable voltage-to-current converter PVIC20 is $1/(2R_1)$. Thus, the voltage-to-current conversion gain gm20 is ½ the voltage-to-current conversion gain gm10. Further, the voltage gain G20 of the inverting amplification circuit 20 in this case is $20 \times \log 10(|G20|/2)$dB. Thus, the voltage gain G20 of the inverting amplification circuit 20 in this case is attenuated by about 6 dB from the voltage gain G10 of the inverting amplification circuit 10.

When the switching elements S203T and S203B are on (short) and the other switching elements are off (open), the voltage-to-current conversion gain gm20 of the programmable voltage-to-current converter PVIC20 is $1/(4R_1)$. Thus, the voltage-to-current conversion gain gm20 is ¼ the voltage-to-current conversion gain gm10. Further, the voltage gain G20 of the inverting amplification circuit 20 in this case is $20 \times \log 10(|G20|/4)$dB. Thus, the voltage gain G20 of the inverting amplification circuit 20 in this case is attenuated by about 12 dB from the voltage gain G10 of the inverting amplification circuit 10.

When the switching elements S204T and S204B are on (short) and the other switching elements are off (open), the voltage-to-current conversion gain gm20 of the programmable voltage-to-current converter PVIC20 is 1/(8R$_1$). Thus, the voltage-to-current conversion gain gm20 is ⅛ the voltage-to-current conversion gain gm10. Further, the voltage gain G20 of the inverting amplification circuit 20 in this case is 20×log 10(|G20|/8)dB. Thus, the voltage gain G20 of the inverting amplification circuit 20 in this case is attenuated by about 18 dB from the voltage gain G10 of the inverting amplification circuit 10.

As described above, the inverting amplification circuit 20 including the programmable voltage-to-current converter PVIC20 can control the voltage gain in a programmable manner.

However, in the inverting amplification circuit 20 shown in FIG. 23, the impedance of the programmable voltage-to-current converter PVIC20 as seen from the both input terminals of the operational amplifier OPA varies with a change in the conducting state of each of a plurality of switching elements placed in the programmable voltage-to-current converter PVIC20. Therefore, the inverting amplification circuit 20 shown in FIG. 23 has a problem that the frequency characteristics of the amplification result Vout varies unintentionally due to the phase rotation of a feedback signal. Further, the inverting amplification circuit 20 shown in FIG. 23 has a problem that the voltage gain of an amplifier circuit in the previous stage (not shown) varies unintentionally due to a change in the impedance as seen from the amplifier circuit in the previous stage.

Embodiments of the invention will be described hereinafter with reference to the drawings. Since the drawings are simplified, the technical scope of the present invention should not be narrowly interpreted based on the illustration of the drawings. Further, the same components are denoted by the same reference symbols, and redundant description will be omitted.

In the following embodiments, the description will be divided into a plurality of sections or embodiments when necessary for the sake of convenience. However, unless explicitly specified otherwise, those sections or embodiments are by no means unrelated to each other, but are in such a relation that one represents a modification, a detailed or supplementary description, etc. of part or whole of the other. Further, in the following embodiments, when a reference is made to the number etc, (including the number, numeric value, quantity, range, etc.) of elements, except in such cases where it is explicitly specified otherwise or the number is obviously limited to a specific number in principle, the number is not limited to the specific number but may be greater or less than the specific number.

Furthermore, in the following embodiments, their constituent elements (including constituent steps) are not necessarily essential, except in such cases where it is explicitly specified otherwise or they are obviously considered to be essential in principle. Likewise, in the following embodiments, when a reference is made to the shape, relative position, etc. of a constituent element or the like, this includes those shapes etc. substantially resembling or similar to that shape etc., except in such cases where it is explicitly specified otherwise or it is obviously considered otherwise in principle. The same applies to the number etc, (including the number, numeric value, quantity, range, etc.).

First Embodiment

Figure 1B:
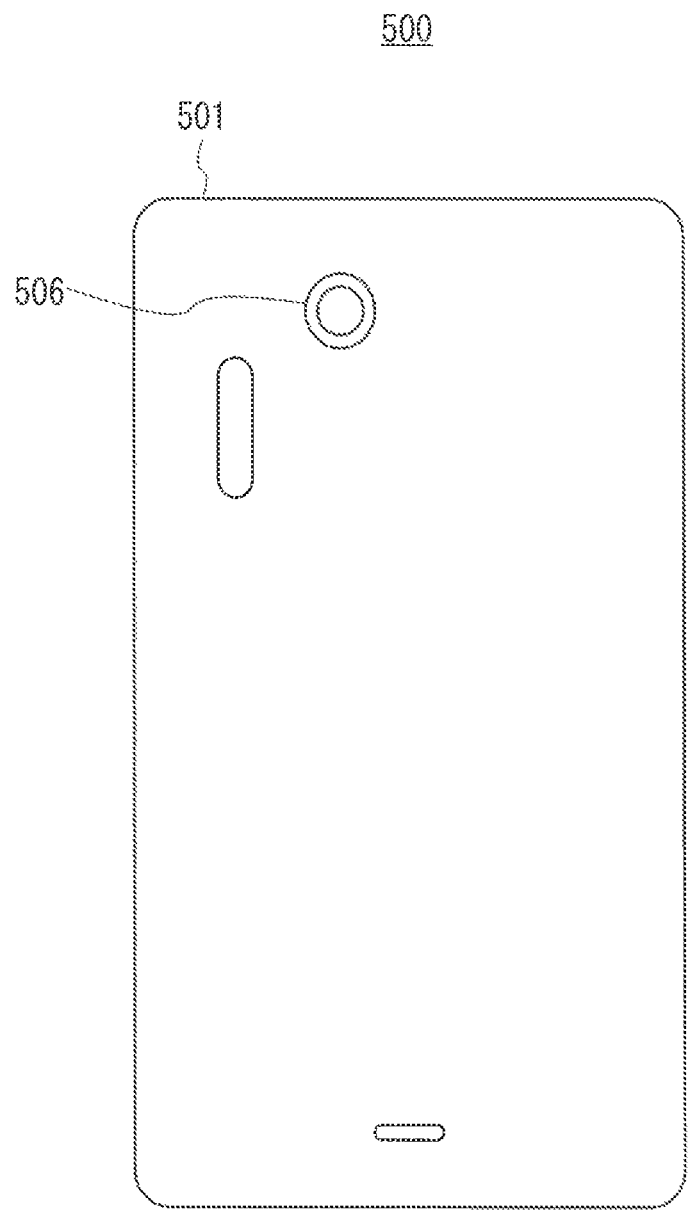
FIG. 1B is an external view showing one example of the radio communication terminal according to the first embodiment.

The overview of a radio communication terminal that is suitable for use as electronic equipment to which an inverting amplification circuit (semiconductor integrated circuit) according to this embodiment is applied is described firstly with reference to FIGS. 1A and 1B. FIGS. 1A and 1B are outline views showing configuration examples of a radio communication terminal 500. Note that FIGS. 1A and 1B show the case where the radio communication terminal 500 is a smartphone. However, the radio communication terminal 500 may be another radio communication terminal such as a feature phone (for example, a folding mobile phone terminal), a portable game terminal, a tablet PC (Personal Computer) or a notebook PC. Further, the inverting amplification circuit (semiconductor integrated circuit) according to this embodiment is applicable also to equipment other than the radio communication terminal as a matter of course.

FIG. 1A shows one principal surface (front surface) of a body 501 of the radio communication terminal 500. On the front surface of the body 501 is a display device 502, a touch panel 503, several operating buttons 504, and a camera device 505. On the other hand, FIG. 1B shows the other principal surface (back surface) of the body 501. On the back surface of the body 501 is a camera device 506.

The display device 502 is an LCD (Liquid Crystal Display), OLED (Organic Light-Emitting Diode) display or the like, and its display plane is mounted on the front surface of the body 501. The touch panel 503 is mounted to cover the display plane of the display device 502 or mounted on the backside of the display device 502 to detect a user's contact position on the display plane. Specifically, a user can intuitively manipulates the radio communication terminal 500 by touching the display plane of the display device 502 with a finger or a special pen (which is typically referred to a stylus). Further, the operating buttons 504 are used for auxiliary manipulation on the radio communication terminal 500. Note that such operating buttons are not mounted in some radio communication terminal.

The camera device 506 is a main camera that is mounted so that its lens unit is on the back surface of the body 501. On the other hand, the camera device 505 is a sub-camera mounted so that its lens unit is on the front surface of the body 501. Note that such a sub-camera is not mounted in some radio communication terminal.

Figure 2:
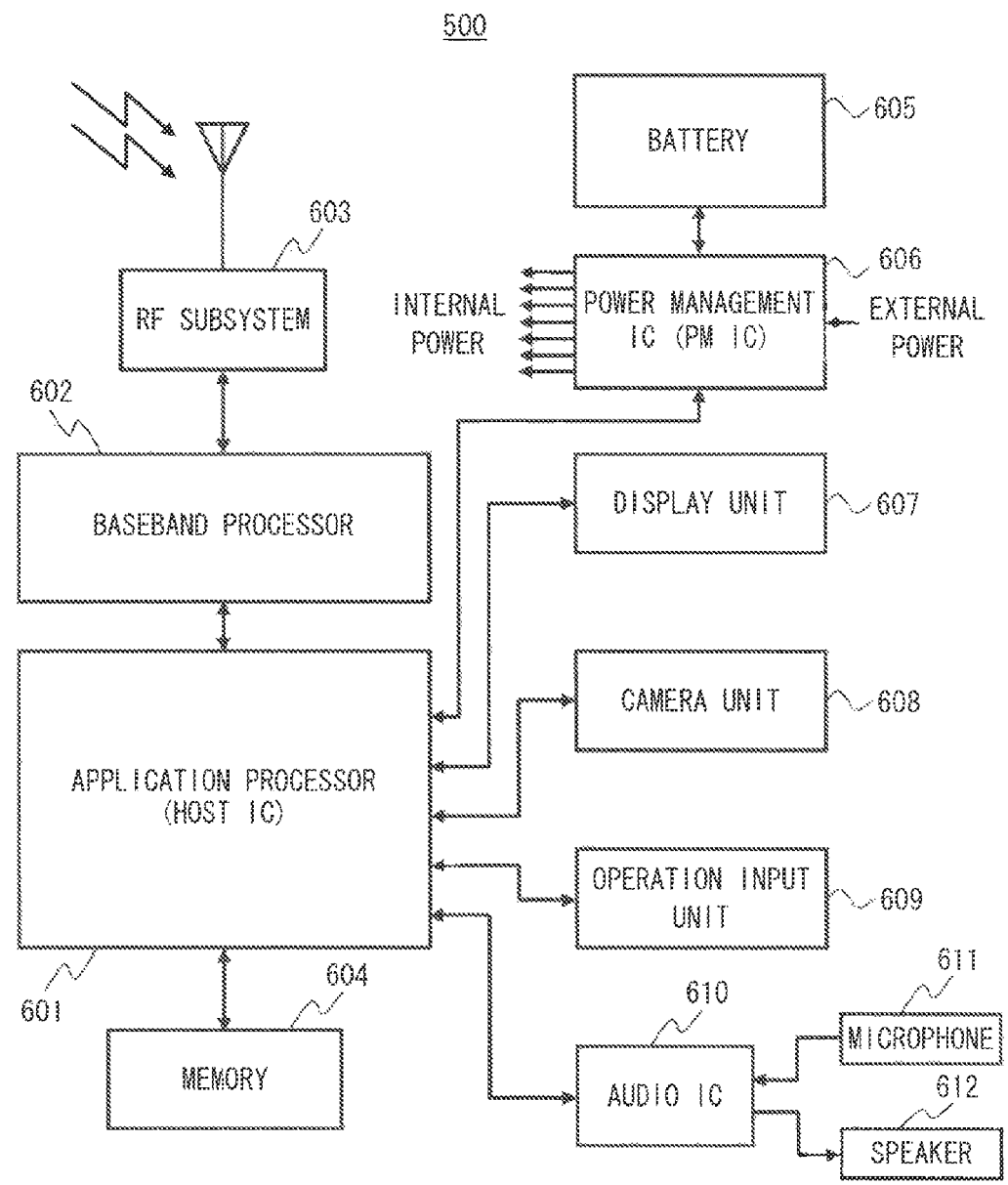
FIG. 2 is a block diagram showing one example of an internal configuration of the radio communication terminal according to the first embodiment.

An internal configuration of the radio communication terminal 500 according to this embodiment is described hereinafter with reference to FIG. 2. FIG. 2 is a block diagram showing one example of an internal configuration of the radio communication terminal 500 according to this embodiment. As shown in FIG. 2, the radio communication terminal 500 includes an application processor 601, a baseband processor 602, an RF (Radio Frequency) subsystem 603, a memory 604, a battery 605, a power management IC (PMIC: Power Management Integrated Circuit) 606, a display unit 607, a camera unit 608, an operation input unit 609, an audio IC 610, a microphone 611, and a speaker 612.

The application processor 601 reads a program stored in the memory 604 and performs processing for implementing the functions of the radio communication terminal 500. For example, the application processor 601 runs an OS (Operating System) program from the memory 604 and further runs an application program that operates on the basis of the OS program.

The baseband processor 602 performs baseband processing including encoding (error correction coding such as convolutional coding or turbo coding) or decoding of data transmitted and received by the radio communication terminal 500. To be more specific, the baseband processor 602 receives transmission data from the application processor 601, encodes the received transmission data and transmits the data to the RF subsystem 603. Further, the baseband processor 602 receives received data from the RF subsystem 603, decodes the received data and transmits the data to the application processor 601.

The RF subsystem 603 performs modulation or demodulation of data transmitted and received by the radio communication terminal 500. To be more specific, the RF subsystem 603 modulates the transmission data received from the baseband processor 602 by means of a carrier wave to generate a transmission signal and outputs the transmission signal through an antenna. Further, the RF subsystem 603 receives a received signal through the antenna, demodulates the received signal by means of a carrier wave to generate received data and transmits the received data to the baseband processor 602.

The memory 604 stores a program and data used by the application processor 601. Further, the memory 604 includes a nonvolatile memory in which stored data is maintained even when power is cut off and a volatile memory in which stored data is cleared when power is cut off.

The battery 605 is an electric battery and used in the case where the radio communication terminal 500 operates not by external power. Note that the radio communication terminal 500 may use the power of the battery 605 when an external power supply is connected as well. Further, it is preferred to use a secondary battery as the battery 605.

The power management IC 606 generates internal power from the battery 605 or the external power. The internal power is supplied to each block of the radio communication terminal 500. At this time, the power management IC 606 controls the voltage of the internal power for each block to receive the internal power. The power management IC 606 makes voltage control of the internal power based on an instruction from the application processor 601. Further, the power management IC 606 can control the supply and cutoff of the internal power for each block. Furthermore, when there is external power supply, the power management IC 606 makes charge control of the battery 605 as well.

The display unit 607 is a liquid crystal display device, for example, and displays various images in accordance with processing in the application processor 601. The images displayed on the display unit 607 include a user interface image for a user to give an instruction for operation to the radio communication terminal 500, a camera image, a moving image and the like.

The camera unit 608 acquires an image in accordance with an instruction from the application processor 601. The operation input unit 609 is a user interface to be operated by a user to give an instruction for operation to the radio communication terminal 500. The audio IC 610 decodes audio data transmitted from the application processor 601 and drives the speaker 612 and further encodes audio information obtained from the microphone 611 to generate audio data and outputs the audio data to the application processor 601.

<Configuration Example of Inverting Amplification Circuit 1 According to First Embodiment>

Figure 3:
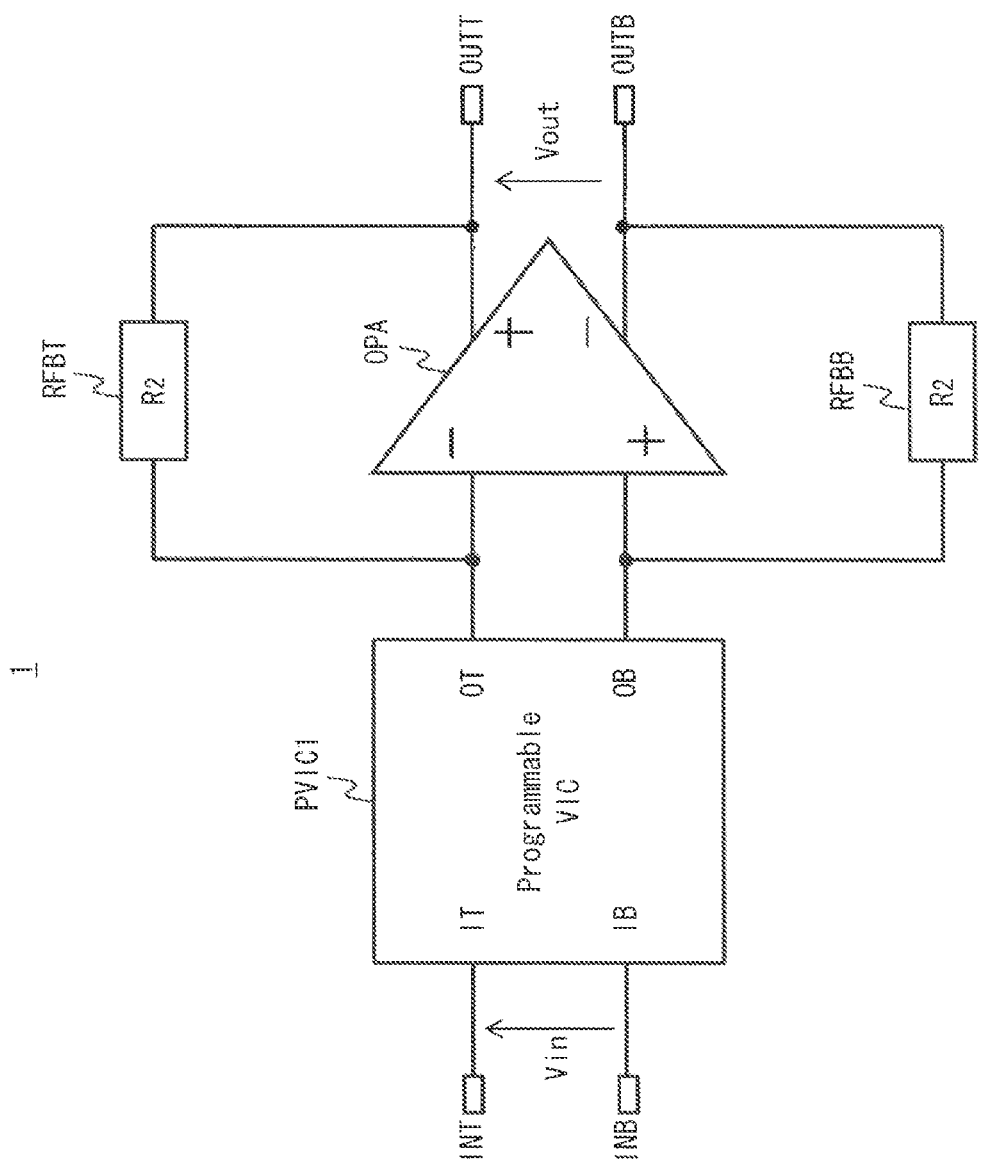
FIG. 3 is a block diagram showing a configuration example of an inverting amplification circuit according to the first embodiment.

FIG. 3 is a diagram showing a configuration example of an inverting amplification circuit (semiconductor integrated circuit) 1 according to the first embodiment. The inverting amplification circuit 1 according to this embodiment includes a programmable voltage-to-current converter that sets a current path through which a current with a desired voltage-to-current conversion gain flows and also sets an alternative path through which a current that is no longer needed based on the voltage-to-current conversion gain detours by switching the conducting state of each of a plurality of switching elements in a programmable manner. The inverting amplification circuit 1 according to this embodiment can thereby reduce the variation of the input/output impedance of the programmable voltage-to-current converter and output an accurate amplification result Vout. This is described specifically below. Note that the inverting amplification circuit 1 shown in FIG. 3 is applied to the RF subsystem 603 in the radio communication terminal 500 shown in FIG. 2, for example.

The inverting amplification circuit 1 shown in FIG. 3 includes an operational amplifier (amplification circuit) OPA, a feedback resistor (first feedback resistor) RFBT, a feedback resistor (second feedback resistor) RFBB, and a programmable voltage-to-current converter (variable resistor unit) PVIC1.

The inverting amplification circuit 1 amplifies an output result Vin of a mixer (not shown) supplied to input terminals (first and second external input terminals) INT and INB and outputs an amplification result (differential amplified signal) Vout from output terminals OUTT and OUTB. The programmable voltage-to-current converter PVIC1 controls the voltage gain of the inverting amplification circuit 1 by switching the internal combined resistance in a programmable manner. The programmable voltage-to-current converter PVIC1 thereby attenuates the amplification result Vout of the inverting amplification circuit 1 in a programmable manner and allows the inverting amplification circuit 1 to operate within the linear operation range, for example.

Input terminals IT and IB of the programmable voltage-to-current converter PVIC1 are respectively connected to input terminals INT and INB of the inverting amplification circuit 1. Output terminals OT and OB of the programmable voltage-to-current converter PVIC1 are respectively connected to an inverting input terminal and a non-inverting input terminal of the operational amplifier OPA. A non-inverting output terminal and an inverting output terminal of the operational amplifier OPA are respectively connected to output terminals OUTT and OUTB of the inverting amplification circuit 1. The feedback resistor RFBT is placed between the non-inverting output terminal and the inverting input terminal of the operational amplifier OPA. The feedback resistor RFBB is placed between the inverting output terminal and the non-inverting input terminal of the operational amplifier OPA.

In this embodiment, the case where the resistance of each of the feedback resistors RFBT and RFBB is $R_2$ is described by way of illustration.

Figure 4:
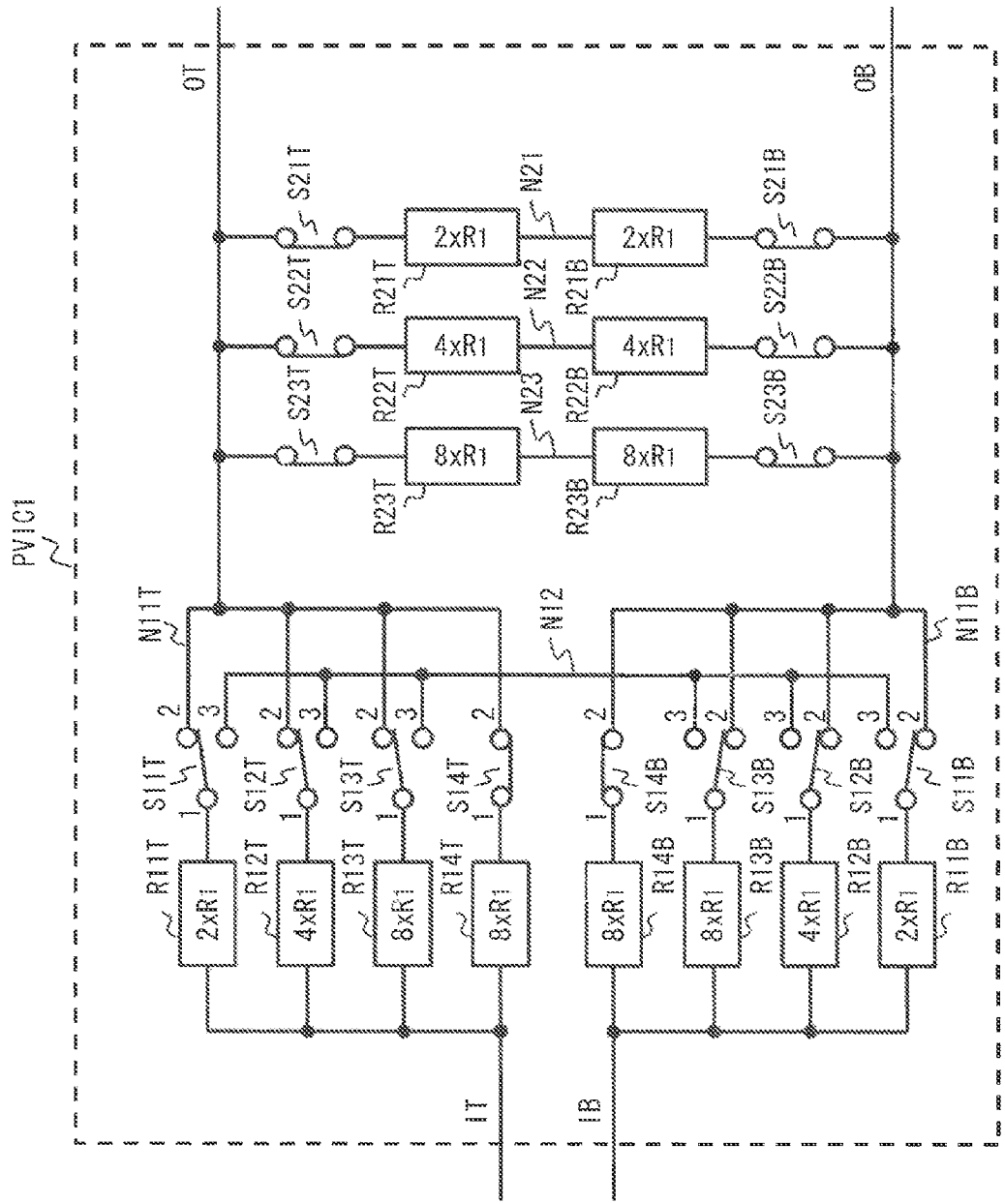
FIG. 4 is a circuit diagram showing a configuration example of a programmable voltage-to-current converter PVIC1 according to the first embodiment.

FIG. 4 is a circuit diagram showing a specific configuration example of the programmable voltage-to-current converter PVIC1. The programmable voltage-to-current converter PVIC1 includes resistor elements (first resistor elements) R11T to R14T, resistor elements (second resistor elements) R11B to R14B, resistor elements (third resistor elements) R21T to R23T and R21B to R23B, switching elements (first switching elements) S11T to S14T, switching elements (second switching elements) S11B to S14B, and switching elements (third switching elements) S21T to S23T and S21B to S23B.

One ends of the resistor elements R11T to R14T are connected to the input terminal IT. The other ends of the resistor elements R11T to R14T are connected to first terminals of the switching elements S11T to S14T, respectively. Second terminals of the switching elements S11T to S14T are connected to the output terminal OT though a node N11T. Third terminals of the switching elements S11T to S13T are connected to a node (common node) N12. One ends of the resistor elements R11B to R14B are connected to the input terminal IB. The other ends of the resistor elements R11B to R14B are connected to first terminals of the switching elements SUB to 514B, respectively. Second terminals of the switching elements S11B to S14B are connected to the output terminal OB though a node N11B. Third terminals of the switching elements S11B to S13B are connected to the node (common node) N12.

The resistor elements R21T and R21B are connected in series between the output terminals OT and OB. The series-connected resistor elements R22T and R22B are connected in parallel with the series-connected resistor elements R21T and R21B. The series-connected resistor elements R23T and R23B are connected in parallel with the series-connected resistor elements R21T and R21B. The switching elements S21T and S21B are connected in series with the resistor elements R21T and R21B. The switching elements S22T and S22B are connected in series with the resistor elements R22T and R22B. The switching elements S23T and S23B are connected in series with the resistor elements R23T and R23B.

In this embodiment, the case where the resistance of each of the resistor elements R11T and R11B is $2R_1$, the resistance of each of the resistor elements R12T and R12B is $4R_1$, the resistance of each of the resistor elements R13T and R13B is $8R_1$, the resistance of each of the resistor elements R14T and R14B is $8R_1$, the resistance of each of the resistor elements R21T and R21B is $2R_1$, the resistance of each of the resistor elements R22T and R22B is $4R_1$, and the resistance of each of the resistor elements R23T and R23B is $8R_1$ is described by way of illustration.

The switching elements S11T to S14T, S11B to S14B, S21T to S23T and S21B to S23B are formed using FET (Field Effect Transistor) such as MOSFET (Metal-Oxide Semiconductor Field Effect Transistor) or JFET (Junction Field Effect Transistor), for example. Thus, the on-resistance of each of the switching elements S11T to S14T, S11B to S14B, S21T to S23T and S21B to S23B is preferably adjusted to satisfy the following equation (4). The effects of element variations, temperature characteristics and the like are thereby reduced.

$$\begin{aligned} RS14 &= RS13 \\ &= 2 \times RS12 \\ &= 4 \times RS11 \\ &= RS23 \\ &= 2 \times RS22 \\ &= 4 \times RS21 \end{aligned} \qquad \text{Equation (4)}$$

Note that RS11 to RS14 indicate the on-resistance of the switching elements S11T to S14T and also indicate the on-resistance of the switching elements S11B to S14B, respectively. Further, RS21 to RS23 indicate the on-resistance of the switching elements S21T to S23T and also indicate the on-resistance of the switching elements S21B to S23B, respectively.

Further, because the switching elements S14T and S14B are always on (short), they are not necessarily needed, as described in detail later. However, the switching elements S14T and S14B are preferably provided because they are effective to reduce the effects of element variations, temperature characteristics and the like.

The programmable voltage-to-current converter PVIC1 controls the conducting state of each of the switching elements S11T to S14T, S11B to S14B and the switching elements S21T to S23T, S21B to S23B based on a control signal from a control circuit (not shown) and thereby controls the combined resistance between the input terminal IT and the output terminal OT and the combined resistance between the input terminal IS and the output terminal OB in a programmable manner. The inverting amplification circuit 1 can thereby amplify the input voltage Vin with a desired voltage gain and output the amplification result Vout.

<Operation of Inverting Amplification Circuit 1 According to First Embodiment>

The operation of the inverting amplification circuit 1 according to this embodiment is described in detail hereinbelow.

FIG. 5 is a diagram showing a relationship between the conducting state of each of a plurality of switching elements provided in the programmable voltage-to-current converter PVIC1 and the voltage gain of the inverting amplification circuit 1.

Hereinafter, the switching elements S11T and S11B are sometimes collectively referred to as switching elements S11. The switching elements S12T and S12B are sometimes collectively referred to as switching elements S12. The switching elements S13T and S13B are sometimes collectively referred to as switching elements S13. The switching elements S14T and S14B are sometimes collectively referred to as switching elements S14. The switching elements S21T and S21B are sometimes collectively referred to as switching elements S21. The switching elements S22T and S22B are sometimes collectively referred to as switching elements S22. The switching elements S23T and S23B are sometimes collectively referred to as switching elements S23.

(Operation of Inverting Amplification Circuit 1 in State A)

First, the operation of the inverting amplification circuit 1 in the case where the first and second terminals of the switching elements S11 to S13 are on (which is represented as "1-2" in the figure), the switching element S14 is on (short), and the switching elements S21 to S23 are off (open) (which is also referred to hereinafter as a state A) is described.

In the state A, a voltage-to-current conversion gain gm1 of the programmable voltage-to-current converter PVIC1 is $1/R_1$, which is the same as the voltage-to-current conversion gain gm10 of the programmable voltage-to-current converter PVIC10 shown in FIG. 22. Further, a voltage gain G1 of the inverting amplification circuit 1 in this case is $20 \times \log 10(|G1|)$dB, which is the same as the voltage gain G10 of the inverting amplification circuit 10.

To be more specific, in the state A, the resistor elements R11T to R14T are connected in parallel between the input terminal IT and the node N11T (output terminal OT). The resistor elements R11B to R14B are connected in parallel between the input terminal IB and the node N11B (output terminal OB). Thus, a combined resistance RtotalT of the input terminal IT as seen from the node N11T and a combined resistance RtotalB of the input terminal IB as seen from the node N11B are represented by the following equation (5).

$$RtotalT = RtotalB = R_1 \qquad \text{Equation (5)}$$

Further, in the state A, because the switching elements S21 to S23 are off (open), an output current Iin1 of the programmable voltage-to-current converter PVIC1 is represented by the following equation (6) when the current flowing from the programmable voltage-to-current converter PVIC1 toward the operational amplifier OPA is a positive current.

$$Iin1 = I_{OT} - I_{OB} = (V_{INT} - V_{INB})/R_1 \qquad \text{Equation (6)}$$

The current Iin1 is converted into a voltage by the feedback resistors RFBT and RFBB and then output from the output terminals OUTT and OUTB. Thus, the voltage gain G1 of the inverting amplification circuit 1 in the state A is represented by the following equation (7).

$$G1 = (V_{OUTT} - V_{OUTB})/(V_{INT} - V_{INB}) \quad \text{Equation (7)}$$
$$= -Iin1 \times R_2 / (V_{INT} - V_{INB})$$
$$= -R_2/R_1$$

The output terminals OT and OB of the programmable voltage-to-current converter PVIC1 are connected to the non-inverting input terminal and the inverting input terminal of the operational amplifier OPA with negative feedback by the feedback resistors RFBT and RFBB, respectively. Thus, the output terminals OT and OB of the voltage-to-current converter PVIC1 are at the same potential (i.e. virtually short-circuited). Accordingly, a combined resistance RtotalI of the output terminals OT and OB as seen from the input terminals IT and is twice RtotalT or RtotalB. Thus, the following equation (8) is established.

$$RtotalI = 2R_1 \quad \text{Equation (8)}$$

On the other hand, the input terminals IT and IB of the programmable voltage-to-current converter PVIC1 are connected to an amplification circuit (not shown) whose output impedance is as low as negligible, for example. Thus, the input terminals IT and IB of the programmable voltage-to-current converter PVIC1 are at the same potential. Accordingly, a combined resistance RtotalO of the input terminals IT and IB as seen from the output terminals OT and OB is twice RtotalT or RtotalB. Thus, the following equation (9) is established.

$$RtotalO = 2R_1 \quad \text{Equation (9)}$$

(Operation of Inverting Amplification Circuit 1 in State B)

Next, the operation of the inverting amplification circuit 1 in the case where the first and third terminals of the switching element S11 are on (which is represented as "1-3" in the figure), the first and second terminals of the switching elements S12 and S13 are on, the switching elements S14 and S21 is on (short), and the switching elements S22 and S23 are off (open) (which is also referred to hereinafter as a state B) is described.

In the state B, the voltage-to-current conversion gain gm1 of the programmable voyage-to-current converter PVIC1 is 1/(2R$_1$). Thus, the voltage-to-current conversion gain gm1 is ½ the voltage-to-current conversion gain gm10. Further, the voltage gain G1 of the inverting amplification circuit 1 in this case is 20×log 10(|G1|/2)dB. Thus, the voltage gain G1 of the inverting amplification circuit 1 in this case is attenuated by about 6 dB from the voltage gain G10 of the inverting amplification circuit 10.

To be more specific, in the state B, the resistor elements R12T to R14T are connected in parallel between the input terminal IT and the node N11T (output terminal OT). The resistor elements R12B to R14B are connected in parallel between the input terminal IB and the node N11B (output terminal OB). On the other hand, the resistor elements R11T and R11B are connected in series between the input terminals IT and IB. Further, the resistor elements R21T and R21B are connected in series between the output terminals OT and OB.

Thus, the combined resistance RtotalT of the input terminal IT as seen from the node N11T and the combined resistance RtotalB of the input terminal IB as seen from the node N11B are represented by the following equation (10).

$$\text{Equation } RtotalT = RtotalB = 2R_1 \quad (10)$$

Thus, the voltage gain G1 of the inverting amplification circuit 1 in the state B is represented by the following equation (11).

$$G1 = -R_2/(2R_1) \quad \text{Equation (11)}$$

In this case, the combined resistance RtotalI of the output terminals OT and OB as seen from the input terminals IT and IB is represented by the following equation (12) because twice RtotalT or RtotalB and the resistor elements R11T and R11B connected in series are connected in parallel.

$$RtotalI = 2R_1 \quad \text{Equation (12)}$$

On the other hand, the combined resistance RtotalO of the input terminals IT and IB as seen from the output terminals OT and OB is represented by the following equation (13) because twice RtotalT or RtotalB and the resistor elements R21T and R21B connected in series are connected in parallel.

$$RtotalO = 2R_1 \quad \text{Equation (13)}$$

(Operation of Inverting Amplification Circuit 1 in State C)

Next, the operation of the inverting amplification circuit 1 in the case where the first and third terminals of the switching elements S11 and S12 are on, the first and second terminals of the switching element S13 are on, the switching elements S21, S22 and S14 are on (short), and the switching element S23 is off (open) (which is also referred to hereinafter as a state C) is described.

In the state C, the voltage-to-current conversion gain gm1 of the programmable voltage-to-current converter PVIC1 is 1/(4R$_1$). Thus, the voltage-to-current conversion gain gm1 is ¼ the voltage-to-current conversion gain gm10. Further, the voltage gain G1 of the inverting amplification circuit 1 in this case is 20×log 10(|G1|/4)dB. Thus, the voltage gain G1 of the inverting amplification circuit 1 in this case is attenuated by about 12 dB from the voltage gain G10 of the inverting amplification circuit 10.

To be more specific, in the state C, the resistor elements R13T and R14T are connected in parallel between the input terminal IT and the node N11T (output terminal OT). The resistor elements R13B and R14B are connected in parallel between the input terminal IB and the node N11B (output terminal OB). On the other hand, the resistor elements R11T and R11B are connected in series between the input terminals IT and IB. The resistor elements R12T and R12B are connected in series between the input terminals IT and IB. Further, the resistor elements R21T and R21B are connected in series between the output terminals OT and OB. The resistor elements R22T and R22B are connected in series between the output terminals OT and OB.

Thus, the combined resistance RtotalT of the input terminal IT as seen from the node N11T and the combined resistance RtotalB of the input terminal IB as seen from the node N11B are represented by the following equation (14).

$$RtotalT = RtotalB = 4R_1 \quad \text{Equation (14)}$$

Thus, the voltage gain G1 of the inverting amplification circuit 1 in the state C is represented by the following equation (15).

$$G1 = -R_2/(4R_1) \quad \text{Equation (15)}$$

In this case, the combined resistance RtotalI of the output terminals OT and OB as seen from the input terminals IT and IB is represented by the following equation (16) because twice RtotalT or RtotalB, the resistor elements R11T and R11B connected in series and the resistor elements R12T and R12B connected in series are connected in parallel.

$$RtotalI = 2R_1 \quad \text{Equation (16)}$$

On the other hand, the combined resistance RtotalO of the input terminals IT and IB as seen from the output terminals OT and OB is represented by the following equation (17)

because twice RtotalT or RtotalB, the resistor elements R21T and R21B connected in series and the resistor elements R22T and R22B connected in series are connected in parallel.

$$<RtotalO = 2R_1 \qquad \text{Equation (17)}$$

(Operation of Inverting Amplification Circuit 1 in State D)

Next, the operation of the inverting amplification circuit 1 in the case where the first and third terminals of the switching elements S11 to S13 are on and the switching elements S21 to S23 and S14 are on (short) (which is also referred to hereinafter as a state D) is described.

In the state D, the voltage-to-current conversion gain gm1 of the programmable voltage-to-current converter PVIC1 is $1/(8R_1)$. Thus, the voltage-to-current conversion gain gm1 is ⅛ the voltage-to-current conversion gain gm10. Further, the voltage gain G1 of the inverting amplification circuit 1 in this case is 20×log 10(|G1|/8)dB. Thus, the voltage gain G1 of the inverting amplification circuit 1 in this case is attenuated by about 18 dB from the voltage gain G10 of the inverting amplification circuit 10.

To be more specific, in the state D, the resistor elements R14T is connected in parallel between the input terminal IT and the node N11T (output terminal OT). The resistor elements R14B is connected in parallel between the input terminal IB and the node N11B (output terminal OB) On the other hand, the resistor elements R11T, R11B, the resistor elements R12T, R12B, and the resistor elements R13T, R13B are connected in series between the input terminals IT and IB, respectively. Further, the resistor elements R21T and R21B, the resistor elements R22T, R22B and the resistor elements R23T, R23B are connected in series between the output terminals OT and OB, respectively.

Thus, the combined resistance RtotalT of the input terminal IT as seen from the node N11T and the combined resistance RtotalB of the input terminal IB as seen from the node N11B are represented by the following equation (18).

$$RtotalT = RtotalB = 8R_1 \qquad \text{Equation (13)}$$

Thus, the voltage gain G1 of the inverting amplification circuit 1 in the state D is represented by the following equation (19).

$$G1 = -R_2/(8R_1) \qquad \text{Equation (19)}$$

In this case, the combined resistance RtotalI of the output terminals OT and OB as seen from the input terminals IT and IB is represented by the following equation (20) because twice RtotalT or RtotalB, the resistor elements R11T and R11B connected in series, the resistor elements R12T and R12B connected in series, and the resistor elements R13T and R13B connected in series are connected in parallel.

$$RtotalI = 2R_1 \qquad \text{Equation (20)}$$

On the other hand, the combined resistance RtotalO of the input terminals IT and IB as seen from the output terminals OT and OB is represented by the following equation (21) because twice RtotalT or RtotalB, the resistor elements R21T and R21B connected in series, the resistor elements R22T and R22B connected in series, and the resistor elements R23T and R23B connected in series are connected in parallel.

$$RtotalO = 2R_1 \qquad \text{Equation (21)}$$

As described above, the programmable voltage-to-current converter PVIC1 according to this embodiment sets a current path through which a current with the desired voltage-to-current conversion gain gm1 flows and also sets an alternative path (the path of the node N12 and the paths of the nodes N21 to N23) through which a current that is no longer needed based on the voltage-to-current conversion gain gm1 detours by switching the conducting state of each of a plurality of switching elements in a programmable manner. The inverting amplification circuit 1 according to this embodiment can thereby keep the combined resistances RtotalI and RtotalO constant even when the conducting state of each of the plurality of switching elements provided in the programmable voltage-to-current converter PVIC1 has changed.

Accordingly, in the inverting amplification circuit 1 according to this embodiment, the problem that the frequency characteristics of the amplification result Vout varies unintentionally due to the phase rotation of a feedback signal does not occur. Further, in the inverting amplification circuit 1 according to this embodiment, the problem that the voltage gain of an amplifier circuit in the previous stage (not shown) varies unintentionally does not occur because the resistance as seen from the amplifier circuit in the previous stage does not change. The inverting amplification circuit 1 according to this embodiment can thereby output the accurate amplification result Vout.

Note that, although the case where the programmable voltage-to-current converter PVIC1 has the alternative path (first alternative path) of the current flowing through the nodes N21 to N23 and the alternative path (second alternative path) of the current flowing through the node N12 is described by way of illustration in this embodiment, it is not limited thereto. The programmable voltage-to-current converter PVIC1 may be altered to the configuration having at least one of the first and second alternative paths. For example, the configuration having only the first alternative path can suppress the unintentional variation of the frequency characteristics of the amplification result Vout due to the phase rotation of a feedback signal. On the other hand, the configuration having only the second alternative path can suppress the unintentional variation of the voltage gain of the amplifier circuit in the previous stage.

Further, although the case where the inverting amplification circuit 1 selectively sets one of four voltage gains that differ by 6 dB each is described by way of illustration in this embodiment, it is not limited thereto. The inverting amplification circuit 1 may be altered to the configuration that selectively sets any number and any value of voltage gains.

Second Embodiment

Figure 6:
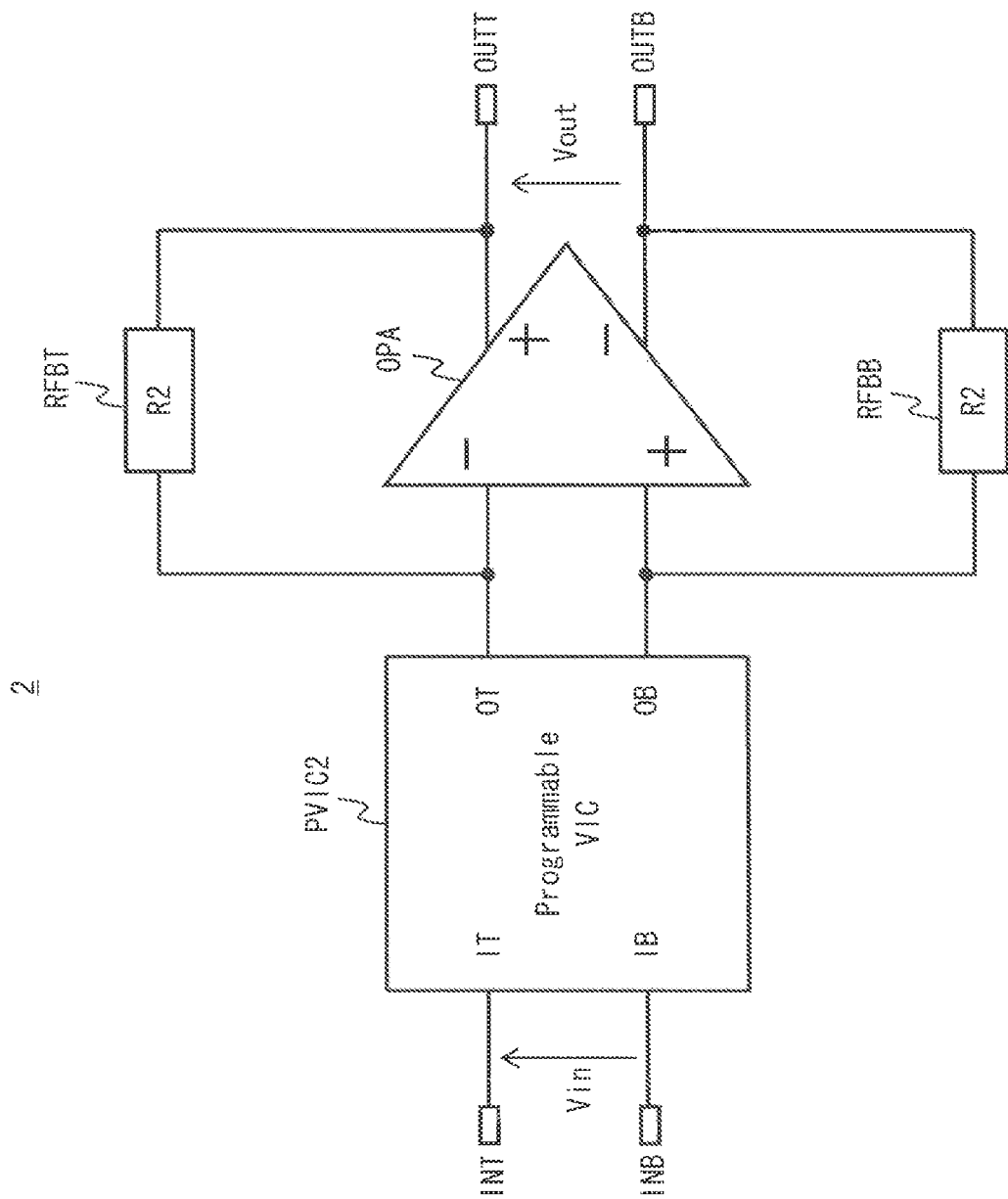
FIG. 6 is a block diagram showing a configuration example of an inverting amplification circuit according to a second embodiment.

FIG. 6 is a diagram showing a configuration example of an inverting amplification circuit (semiconductor integrated circuit) 2 according to a second embodiment. The inverting amplification circuit 2 shown in FIG. 6 is different from the inverting amplification circuit 1 shown in FIG. 3 in the configuration of the programmable voltage-to-current converter. This is described specifically below. Note that the inverting amplification circuit 2 shown in FIG. 6 is applied to the RF subsystem 603 in the radio communication terminal 500 shown in FIG. 2, for example.

The inverting amplification circuit 2 shown in FIG. 6 includes an operational amplifier (amplification circuit) OPA, a feedback resistor (first feedback resistor) RFBT, a feedback resistor (second feedback resistor) RFBB, and a programmable voltage-to-current converter (variable resistor unit) PVIC2. The components other than the programmable voltage-to-current converter PVIC2 are the same as those of the inverting amplification circuit 1 shown in FIG. 3 and not redundantly described.

Figure 7:
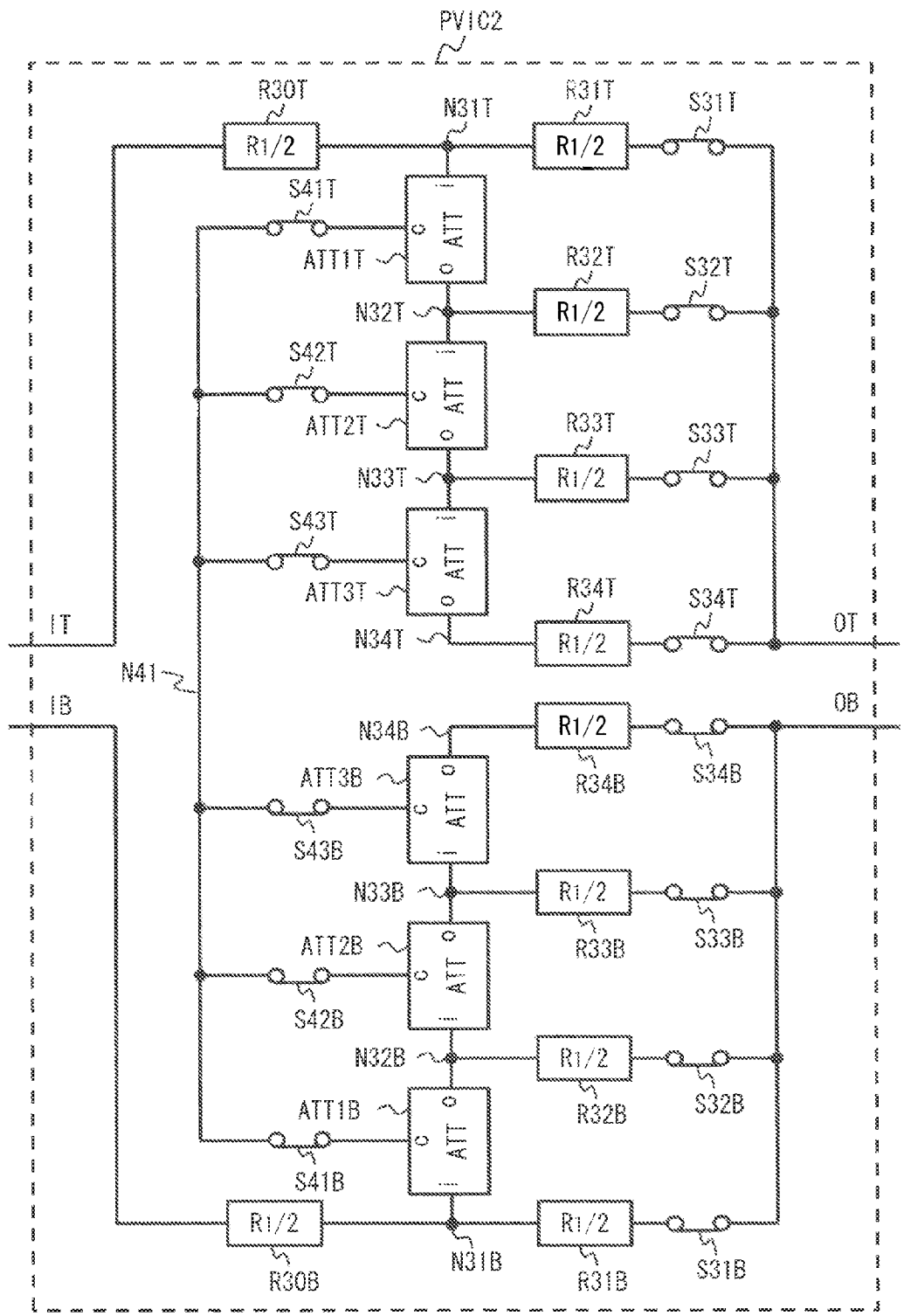
FIG. 7 is a circuit diagram showing a configuration example of a programmable voltage-to-current converter PVIC2 according to the second embodiment.

FIG. 7 is a circuit diagram showing a specific configuration example of the programmable voltage-to-current converter PVIC2. The programmable voltage-to-current converter PVIC2 includes resistor elements (first resistor elements)

R30T to R34T, resistor elements (second resistor elements) R30B to R34B, switching elements (first switching elements) S31T to S34T, switching elements (second switching elements) S31B to S34B, switching elements (third switching elements) S41T to S43T, switching elements (fourth switching elements) S41B to S43B, resistance attenuators (first resistance attenuators) ATT1T to ATT3T, and resistance attenuators (second resistance attenuators) ATT1B to ATT3B.

In the resistor element R30T, one end is connected to the input terminal IT, and the other end is connected to a node N31T. In the resistor elements R31T to R34T, one ends are connected to nodes N31T to N34T, respectively, and the other ends are connected to one ends of the switching elements S31T to S34T, respectively. The other ends of the switching elements S31T to S34T are connected to the output terminal OT. In the resistance attenuator ATT1T, a terminal i is connected to the node N31T, a terminal o is connected to the node N32T, and a terminal c is connected to one end of the switching element S41T. In the resistance attenuator ATT2T, a terminal i is connected to the node N32T, a terminal o is connected to the node N33T, and a terminal c is connected to one end of the switching element S42T. In the resistance attenuator ATT3T, a terminal i is connected to the node N33T, a terminal o is connected to the node N34T, and a terminal c is connected to one end of the switching element S43T. The other ends of the switching elements S41T to S43T are connected to a node (common node) N41.

In the resistor element R30B, one end is connected to the input terminal IB, and the other end is connected to a node N31B. In the resistor elements R31B to R34B, one ends are connected to nodes N31B to N34B, respectively, and the other ends are connected to one ends of the switching elements S31B to S34B, respectively. The other ends of the switching elements S31B to S34B are connected to the output terminal OB. In the resistance attenuator ATT1B, a terminal i is connected to the node N31B, a terminal o is connected to the node N32B, and a terminal c is connected to one end of the switching element S41B. In the resistance attenuator ATT2B, a terminal i is connected to the node N32B, a terminal o is connected to the node N33B, and a terminal c is connected to one end of the switching element S42B. In the resistance attenuator ATT3B, a terminal i is connected to the node N335, a terminal o is connected to the node N345, and a terminal c is connected to one end of the switching element S43B. The other ends of the switching elements S41B to S43B are connected to the node (common node) N41.

In this embodiment, the case where the resistance of each of the resistor elements R30T to R34T and R30B to R34B is $R_1/2$ is described by way of illustration.

The switching elements S31T to S34T, S31B to S34B, S41T to S43T and S41B to S43B are formed using FET such as MOSFET or JFET, for example. Note that the switching elements S31T to S34T, S315 to S345, S41T to S43T and S41B to S43B may have the same on-resistance.

<First Specific Configuration Example of Resistance Attenuator>

Figure 8:
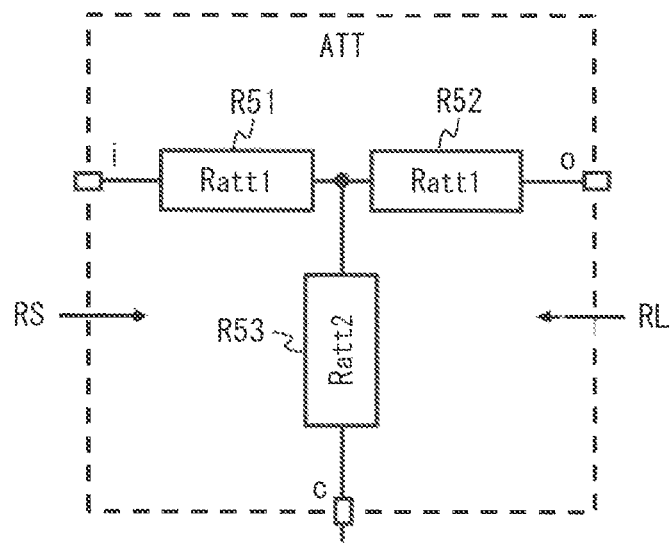
FIG. 8 is a circuit diagram showing a T-type resistance attenuator.

FIG. 8 is a diagram showing a first specific configuration example of a resistance attenuator. The resistance attenuator shown in FIG. 8 is a so-called T type resistance attenuator and includes resistor elements R51 to R53. One end of the resistor element 551 is connected to the terminal i. One end of the resistor element R52 is connected to the terminal o. One end of the resistor element R53 is connected to the terminal (common terminal) c. The other ends of the resistor elements R51 to R53 are connected to one another.

Note that, in the following example, the case where the impedance of the resistance attenuator seen from the terminal is RS, the impedance of the resistance attenuator seen from the terminal o is RL, the resistance of each of the resistor elements R51 and R52 is Ratt1, and the resistance of the resistor element R53 is Ratt2 is described by way of illustration.

The resistance values Ratt1 and Ratt2 of each of the resistor elements R51 to R53 when the amount of attenuation of the resistance attenuator shown in FIG. 8 is XdB are represented by the following equations (22) and (23).

$$Ratt\,1 = RS \cdot \frac{k^2+1}{k^2-1} - 2\sqrt{RS \cdot RL} \cdot \frac{k}{k^2-1} \quad \text{Equation (22)}$$

$$Ratt\,2 = 2\sqrt{RS \cdot RL} \cdot \frac{k}{k^2-1} \quad \text{Equation (23)}$$

where $k = 10^{X/20}$.

<Second Specific Configuration Example of Resistance Attenuator>

Figure 9:
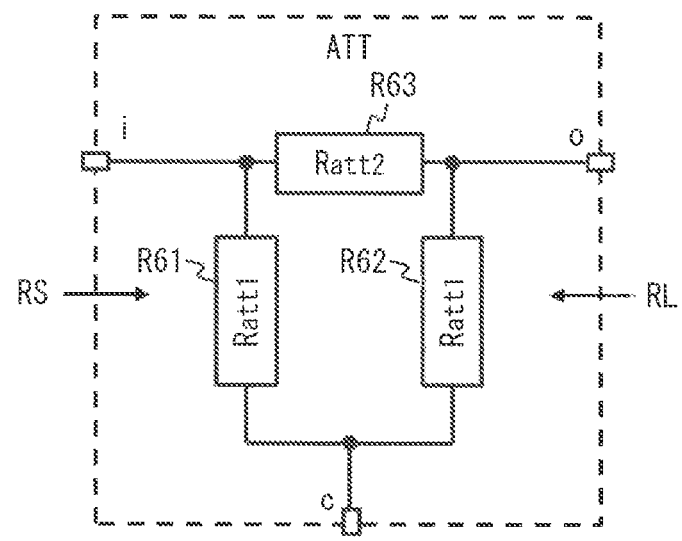
FIG. 9 is a circuit diagram showing a n-type resistance attenuator.

FIG. 9 is a diagram showing a second specific configuration example of a resistance attenuator. The resistance attenuator shown in FIG. 9 is a so-called n-type resistance attenuator and includes resistor elements R61 to R63. In the resistor element R61, one end is connected to the terminal (common terminal) c and the other end is connected to the terminal i. In the resistor element R62, one end is connected to the terminal c and the other end is connected to the terminal o. In the resistor element R63, one end is connected to the terminal i and the other end is connected to the terminal o.

Note that, in the following example, the case where the impedance of the resistance attenuator seen from the terminal is RS, the impedance of the resistance attenuator seen from the terminal o is RL, the resistance of each of the resistor elements R61 and R62 is Ratt1, and the resistance of the resistor element R63 is Ratt2 is described by way of illustration.

The resistance values Ratt1 and Ratt2 of each of the resistor elements R61 to R63 when the amount of attenuation of the resistance attenuator shown in FIG. 9 is XdB are represented by the following equations (24) and (25).

$$Ratt\,1 = \frac{(k^2-1) \cdot \sqrt{RS \cdot RL}}{\sqrt{\frac{RL}{RS} \cdot (k^2+1) - 2k^2}} \quad \text{Equation (24)}$$

$$Ratt\,2 = \sqrt{RS \cdot RL} \cdot \frac{k^2-1}{2k} \quad \text{Equation (25)}$$

where $k = 10^{X/20}$.

In this embodiment, the case where the resistance attenuators ATT1T to ATT3T and ATT1B to ATT3B are all T-type resistance attenuators shown in FIG. 8 is described by way of illustration.

When the amount of attenuation of each resistance attenuator is 6 dB, $k \approx 2$. Further, when $RS=RL=R_1/2$, $Ratt1=R_1/6$ and $Ratt2=2R_1/3$ from the equations (22) and (23). Hereinafter, the case where $Ratt1=R_1/6$ and $Ratt2=2R_1/3$ is described by way of illustration.

The programmable voltage-to-current converter PVIC2 controls the conducting state of each of the switching elements S31T to S34T, S31B to S34B, S41T to S43T and S41B to S43B based on a control signal from a control circuit (not shown) and thereby controls the combined resistance between the input terminal IT and the output terminal OT and the combined resistance between the input terminal IB and the output terminal OB in a programmable manner. The inverting amplification circuit 2 can thereby amplify the input voltage Vin with a desired voltage gain and output the amplification result (differential amplified signal) Vout.

<Operation of Inverting Amplification Circuit 2 According to Second Embodiment>

The operation of the inverting amplification circuit according to this embodiment is described in detail hereinbelow. FIG. 10 is a diagram showing a relationship between the conducting state of each of a plurality of switching elements provided in the programmable voltage-to-current converter PVIC2 and the voltage gain of the inverting amplification circuit 2.

(Operation of Inverting Amplification Circuit 2 in State A)

First, the operation of the inverting amplification circuit 2 in the case where the switching elements S31T and S31B are on (short), and the other switching elements are off (open) (which is also referred to hereinafter as a state A) is described.

In the state A, a voltage-to-current conversion gain gm2 of the programmable voltage-to-current converter PVIC2 is $1/R_1$, which is the same as the voltage-to-current conversion gain gm10 of the programmable voltage-to-current converter PVIC10 shown in FIG. 22. Further, a voltage gain G2 of the inverting amplification circuit 2 in this case is 20×log 10(|G2|)dB, which is the same as the voltage gain G10 of the inverting amplification circuit 10.

To be more specific, in the state A, the resistor elements R30T and R31T are connected in series between the input terminal IT and the output terminal OT. The resistor elements R30B and R31B are connected in series between the input terminal IB and the output terminal OB. Thus, a combined resistance RtotalT of the input terminal IT as seen from the output terminal OT and a combined resistance RtotalB of the input terminal IB as seen from the output terminal OB are represented by the following equation (26).

$$RtotalT = RtotalB = R_1 \qquad \text{Equation (26)}$$

Thus, in the state A, an output current Iin2 of the programmable voltage-to-current converter PVIC2 is represented by the following equation (27) when the current flowing from the programmable voltage-to-current converter PVIC2 toward the operational amplifier OPA is a positive current.

$$Iin2 = I_{OT} - I_{OB} = (V_{INT} - V_{INB})/R_1 \qquad \text{Equation (27)}$$

The current Iin2 is converted into a voltage by the feedback resistors RFBT and RFBB and then output from the output terminals OUTT and OUTB. Thus, the voltage gain G2 of the inverting amplification circuit 2 in the state A is represented by the following equation (28).

$$\begin{aligned} G2 &= (V_{OUTT} - V_{OUTB})/(V_{INT} - V_{INB}) \\ &= -Iin2 \times R_2/(V_{INT} - V_{INB}) \\ &= -R_2/R_1 \end{aligned} \qquad \text{Equation (28)}$$

The output terminals OT and OB of the programmable voltage-to-current converter PVIC2 are connected to the non-inverting input terminal and the inverting input terminal of the operational amplifier OPA with negative feedback by the feedback resistors RFBT and RFBB, respectively. Thus, the output terminals OT and OB of the voltage-to-current converter PVIC2 are at the same potential (i.e. virtually short-circuited). Accordingly, a combined resistance RtotalI of the output terminals OT and OB as seen from the input terminals IT and IB is twice RtotalT or RtotalB. Thus, the following equation (29) is established.

$$RtotalI = 2R_1 \qquad \text{Equation (29)}$$

On the other hand, the input terminals IT and IB of the programmable voltage-to-current converter PVIC2 are connected to an amplification circuit (not shown) whose output impedance is as low as negligible, for example. Thus, the input terminals IT and IB of the programmable voltage-to-current converter PVIC2 are at the same potential. Accordingly, a combined resistance RtotalO of the input terminals IT and IB as seen from the output terminals OT and OB is twice RtotalT or RtotalB. Thus, the following equation (30) is established.

$$RtotalO = 2R_1 \qquad \text{Equation (30)}$$

(Operation of Inverting Amplification Circuit 2 in State B)

Next, the operation of the inverting amplification circuit 2 in the case where the switching elements S32T, S32B, S41T and S41B are on (short), and the other switching elements are off (open) (which is also referred to hereinafter as a state B) is described.

In the state B, because the switching elements S31T and S31B are off (open), no current flows through the resistor elements R31T and R31B that are connected in series thereto. Further, because the switching elements S33T, S34T, S42T, S43T, S33B, S34B, S42B and S43B are off (open), no current flows through the resistance attenuators ATT2T, ATT3T, ATT2B and ATT3B that are connected thereto.

Figure 11:
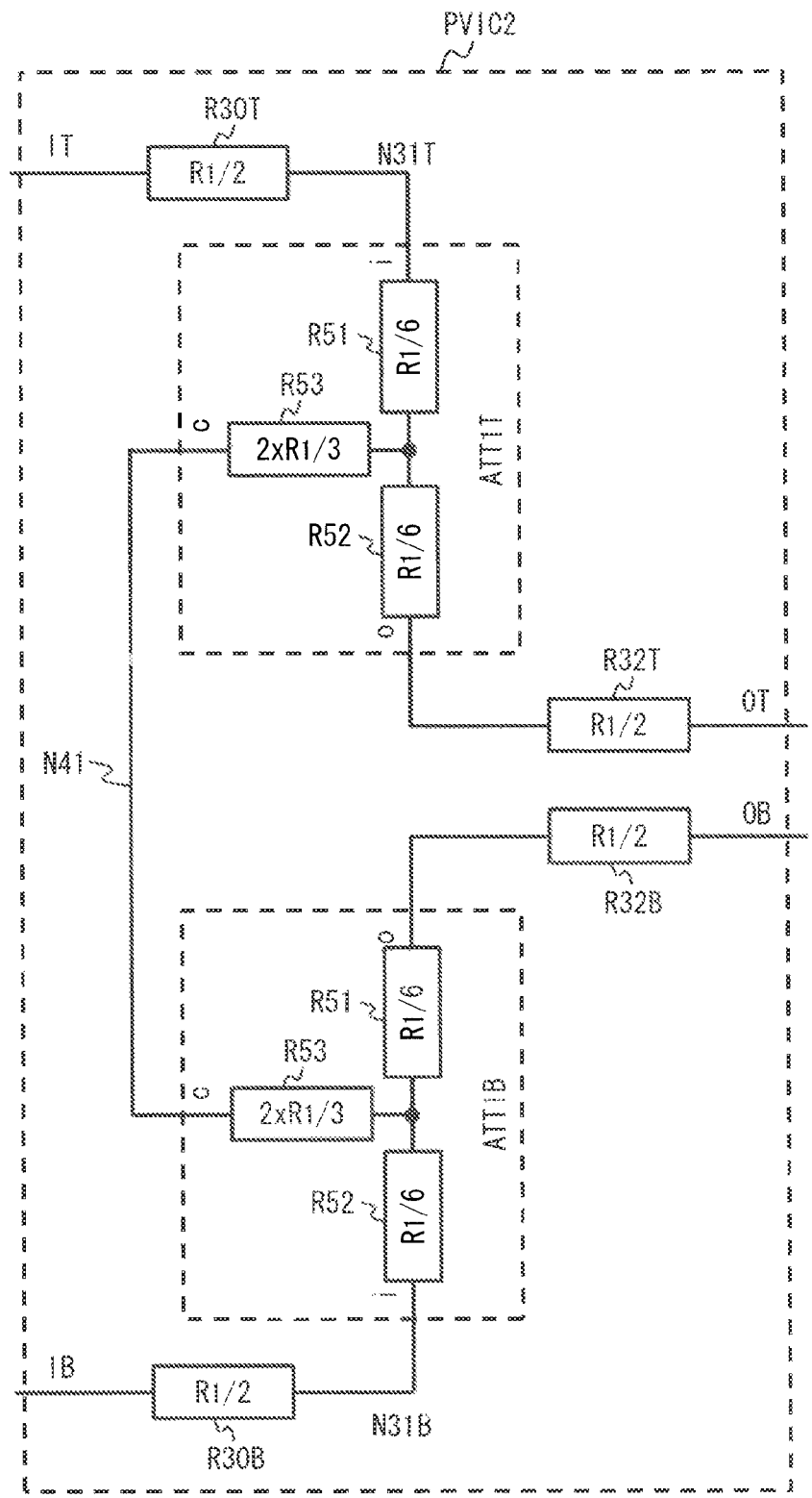
FIG. 11 is a diagram showing an equivalent circuit of the programmable voltage-to-current converter PVIC2 according to the second embodiment.

FIG. 11 is a diagram showing a configuration of the programmable voltage-to-current converter PVIC2 where the switching elements and the path through which no current flows are not illustrated in the state B. As is obvious from FIG. 11, in the state B, the configuration of the programmable voltage-to-current converter PVIC2 when the output terminals OT and OB are seen from the input terminals IT and IB and the configuration of the programmable voltage-to-current converter PVIC2 when the input terminals IT and IB are seen from the output terminals OT and OB are the same.

The output terminals OT and OB of the programmable voltage-to-current converter PVIC2 are connected to the non-inverting input terminal and the inverting input terminal of the operational amplifier OPA with negative feedback by the feedback resistors RFBT and RFBB, respectively. Thus, the output terminals OT and OB of the voltage-to-current converter PVIC2 are at the same potential (i.e. virtually short-circuited). On the other hand, the input terminals IT and IB of the programmable voltage-to-current converter PVIC2 are connected to an amplification circuit (not shown) whose output impedance is as low as negligible, for example. Thus, the input terminals IT and IB of the programmable voltage-to-current converter PVIC2 are at the same potential. Consequently, the combined resistance RtotalI of the output terminals OT and OB as seen from the input terminals IT and IB and the combined resistance RtotalO of the input terminals IT and IB as seen from the output terminals OT and OB are represented by the following equation (31).

$$RtotalI = RtotalO = 2R_1 \qquad \text{Equation (31)}$$

Figure 12:
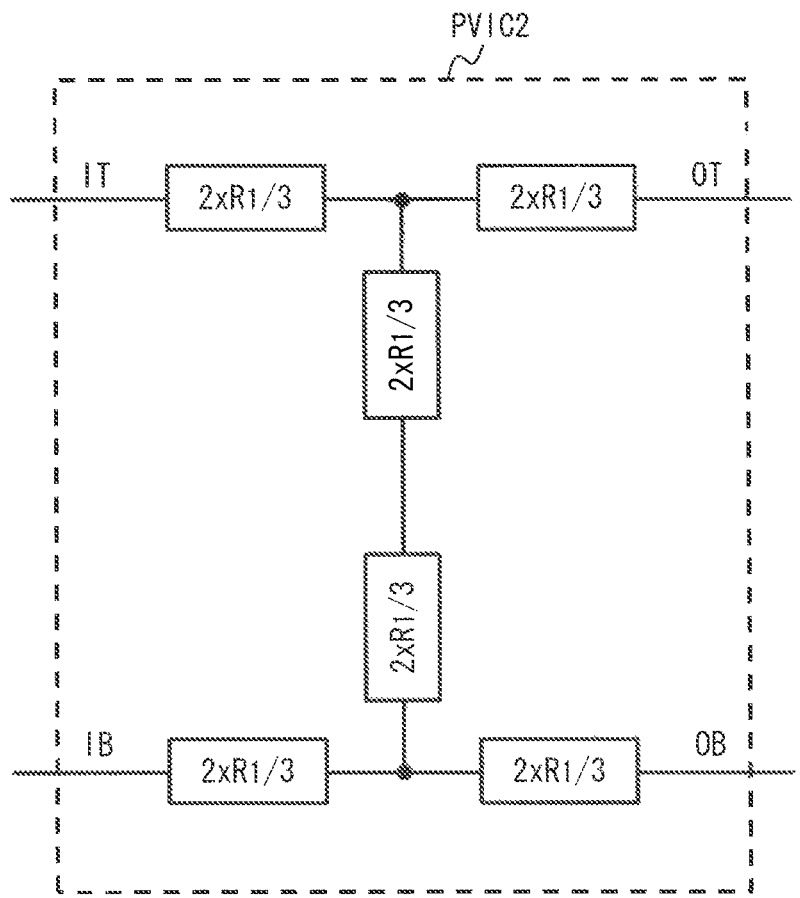
FIG. 12 is a diagram showing an equivalent circuit of the programmable voltage-to-current converter PVIC2 according to the second embodiment.

FIG. 12 is an equivalent circuit of FIG. 11. Referring to FIG. 12, in the state B, the output current Iin2 of the programmable voltage-to-current converter PVIC2 is represented by the following equation (32) when the current flowing from the programmable voltage-to-current converter PVIC2 toward the operational amplifier OPA is a positive current.

$$Iin2 = I_{OT} - I_{OB} = (V_{INT} - V_{INB})/(2R_1) \quad \text{Equation (32)}$$

Thus, the voltage gain G2 of the inverting amplification circuit 2 in the state B is represented by the following equation (33).

$$G2 = (V_{OUTT} - V_{OUTB})/(V_{INT} - V_{INB}) \quad \text{Equation (33)}$$
$$= -Iin2 \times R_2 / (V_{INT} - V_{INB})$$
$$= -R_2/(2R_1)$$

In other words, the voltage gain G2 of the inverting amplification circuit 2 in the state B is 20×log 10(|G2|/2)dB. Thus, the voltage gain G2 of the inverting amplification circuit 2 in the state B is attenuated by about 6 dB from the voltage gain G10 of the inverting amplification circuit 10.

(Operation of Inverting Amplification Circuit 2 in State C)

Next, the operation of the inverting amplification circuit 2 in the case where the switching elements S33T, S333, S41T, S41B, S42T and S42B are on (short), and the other switching elements are off (open) (which is also referred to hereinafter as a state C) is described.

In the state C, because the switching elements S31T, S31B, S32T and S32B are off (open), no current flows through the resistor elements R31T, R31B, R32T and R32B that are connected in series thereto. Further, because the switching elements S34T, S34B, S43T and S43B are off (open), no current flows through the resistance attenuators ATT3T and ATT3B that are connected thereto.

Figure 13:
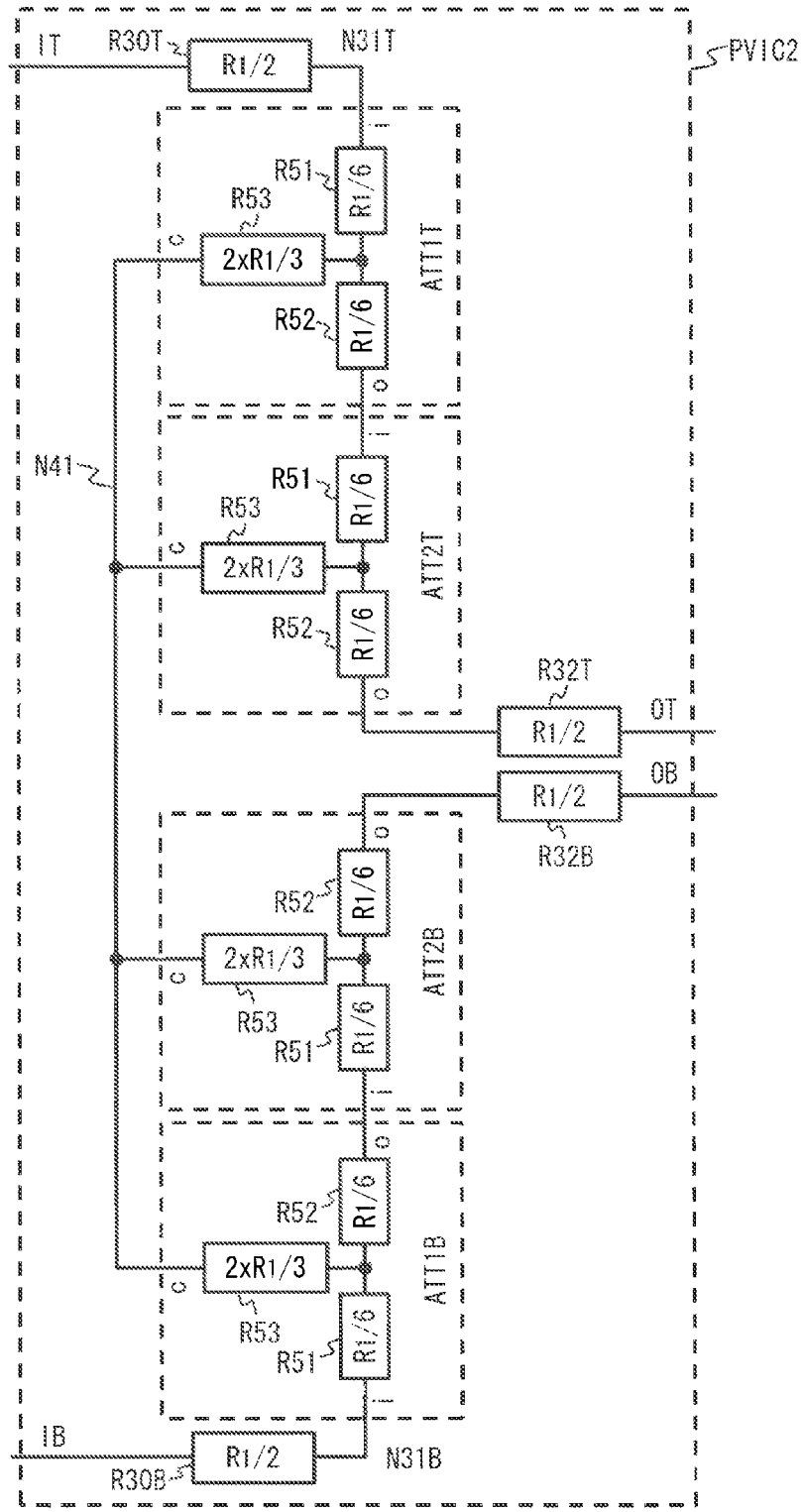
FIG. 13 is a diagram showing an equivalent circuit of the programmable voltage-to-current converter PVIC2 according to the second embodiment.

FIG. 13 is a diagram showing a configuration of the programmable voltage-to-current converter PVIC2 where the switching elements and the path through which no current flows are not illustrated in the state C. As is obvious from FIG. 13, in the state C, the configuration of the programmable voltage-to-current converter PVIC2 when the output terminals OT and OB are seen from the input terminals IT and IB and the configuration of the programmable voltage-to-current converter PVIC2 when the input terminals IT and IB are seen from the output terminals OT and OB are the same.

The output terminals OT and OB of the programmable voltage-to-current converter PVIC2 are connected to the non-inverting input terminal and the inverting input terminal of the operational amplifier OPA with negative feedback by the feedback resistors RFBT and RFBB, respectively. Thus, the output terminals OT and OB of the voltage-to-current converter PVIC2 are at the same potential (i.e. virtually short-circuited). On the other hand, the input terminals IT and IB of the programmable voltage-to-current converter PVIC2 are connected to an amplification circuit (not shown) whose output impedance is as low as negligible, for example. Thus, the input terminals IT and IB of the programmable voltage-to-current converter PVIC2 are at the same potential. Consequently, the combined resistance RtotalI of the output terminals OT and OB as seen from the input terminals IT and IB and the combined resistance RtotalO of the input terminals IT and IB as seen from the output terminals OT and OB are represented by the following equation (34).

$$RtotalI = RtotalO = 2R_1 \quad \text{Equation (34)}$$

Figure 14:
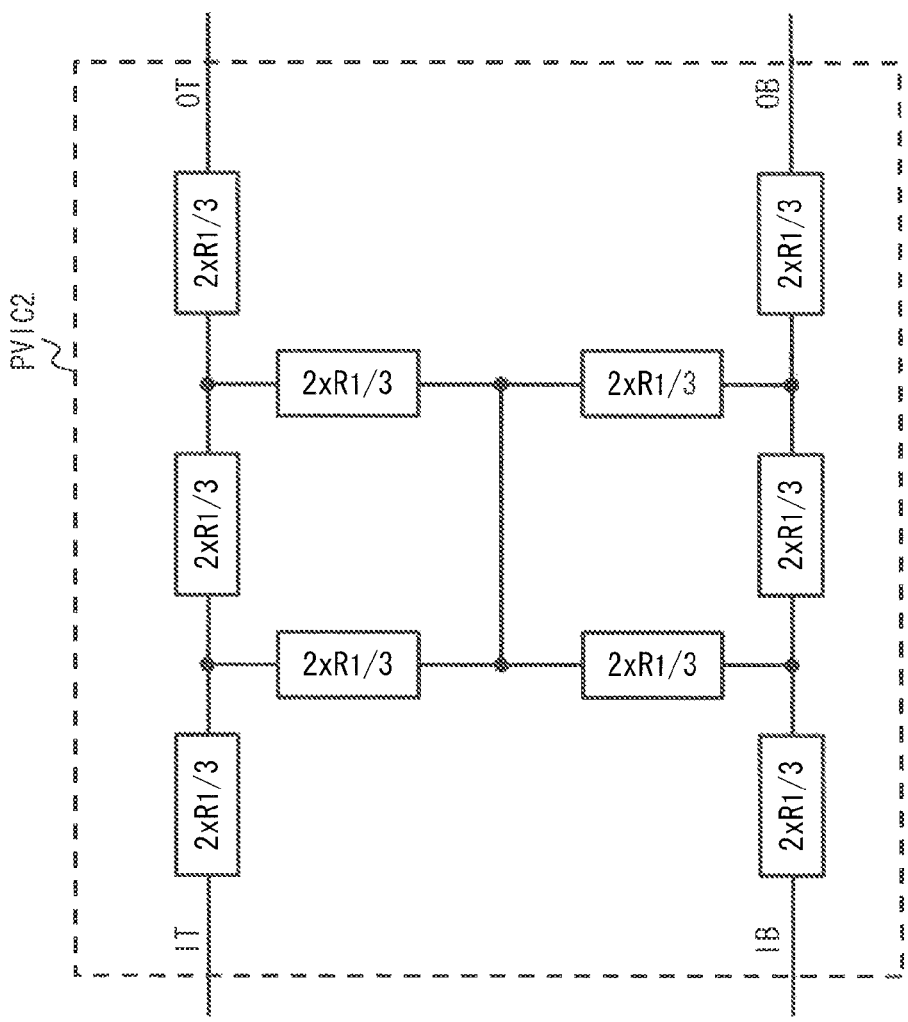
FIG. 14 is a diagram showing an equivalent circuit of the programmable voltage-to-current converter PVIC2 according to the second embodiment.

FIG. 14 is an equivalent circuit of FIG. 13. Referring to FIG. 14, in the state C, the output current Iin2 of the programmable voltage-to-current converter PVIC2 is represented by the following equation (35) when the current flowing from the programmable voltage-to-current converter PVIC2 toward the operational amplifier OPA is a positive current.

$$Iin2 = I_{OT} - I_{OB} = (V_{INT} - V_{INB})/(4R_1) \quad \text{Equation (35)}$$

Thus, the voltage gain G2 of the inverting amplification circuit 2 in the state C is represented by the following equation (36).

$$G2 = (V_{OUTT} - V_{OUTB})/(V_{INT} - V_{INB}) \quad \text{Equation (36)}$$
$$= -Iin2 \times R_2 / (V_{INT} - V_{INB})$$
$$= -R_2/(4R_1)$$

In other words, the voltage gain G2 of the inverting amplification circuit 2 in the state C is 20×log 10(|G2|/4)dB. Thus, the voltage gain G2 of the inverting amplification circuit 2 in the state C is attenuated by about 12 dB from the voltage gain G10 of the inverting amplification circuit 10.

(Operation of Inverting Amplification Circuit 2 in State D)

Next, the operation of the inverting amplification circuit 2 in the case where the switching elements S34T, S34B, S41T, S41B, S42T, S42B, S43T and S43B are on (short), and the other switching elements are off (open) (which is also referred to hereinafter as a state D) is described.

In the state D, because the switching elements S31T, S31B, S32T, S32B, S33T and S33B are off (open), no current flows through the resistor elements R31T, R31B, R32T, R32B, R33T and R33B that are connected in series thereto.

Figure 15:
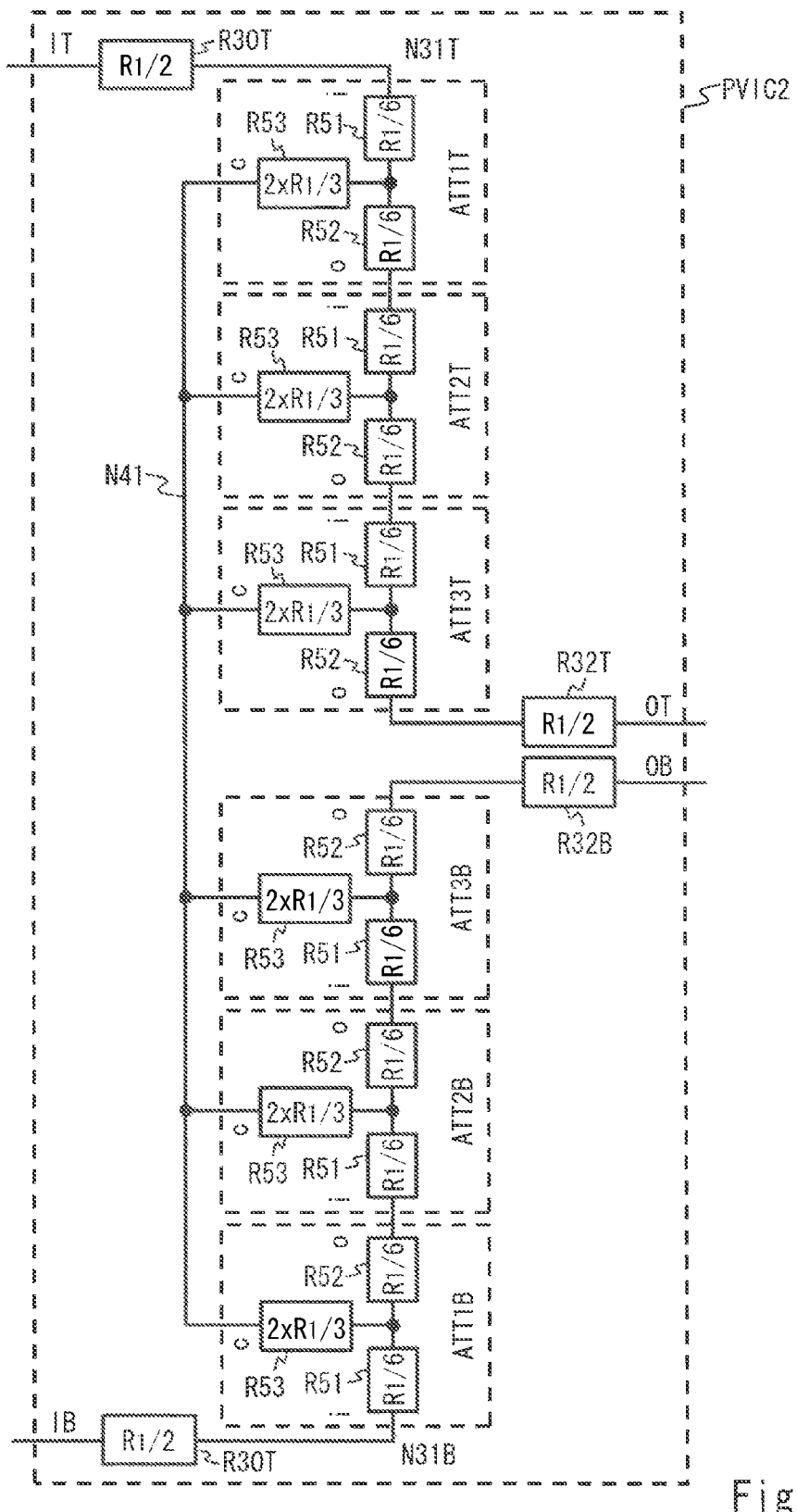
FIG. 15 is a diagram showing an equivalent circuit of the programmable voltage-to-current converter PVIC2 according to the second embodiment.

FIG. 15 is a diagram showing a configuration of the programmable voltage-to-current converter PVIC2 where the switching elements and the path through which no current flows are not illustrated in the state D. As is obvious from FIG. 15, in the state D, the configuration of the programmable voltage-to-current converter PVIC2 when the output terminals OT and OB are seen from the input terminals IT and IB and the configuration of the programmable voltage-to-current converter PVIC2 when the input terminals IT and IB are seen from the output terminals OT and OB are the same.

The output terminals OT and OB of the programmable voltage-to-current converter PVIC2 are connected to the non-inverting input terminal and the inverting input terminal of the operational amplifier OPA with negative feedback by the feedback resistors RFBT and RFBB, respectively. Thus, the output terminals OT and OB of the voltage-to-current converter PVIC2 are at the same potential (i.e. virtually short-circuited). On the other hand, the input terminals IT and IB of the programmable voltage-to-current converter PVIC2 are connected to an amplification circuit (not shown) whose output impedance is as low as negligible, for example Thus, the input terminals IT and IB of the programmable voltage-to-current converter PVIC2 are at the same potential. Consequently, the combined resistance RtotalI of the output terminals OT and OB as seen from the input terminals IT and IB and the combined resistance RtotalO of the input terminals IT and IB as seen from the output terminals OT and OB are represented by the following equation (37).

$$RtotalI = RtotalO = 2R_1 \quad \text{Equation (37)}$$

Figure 16:
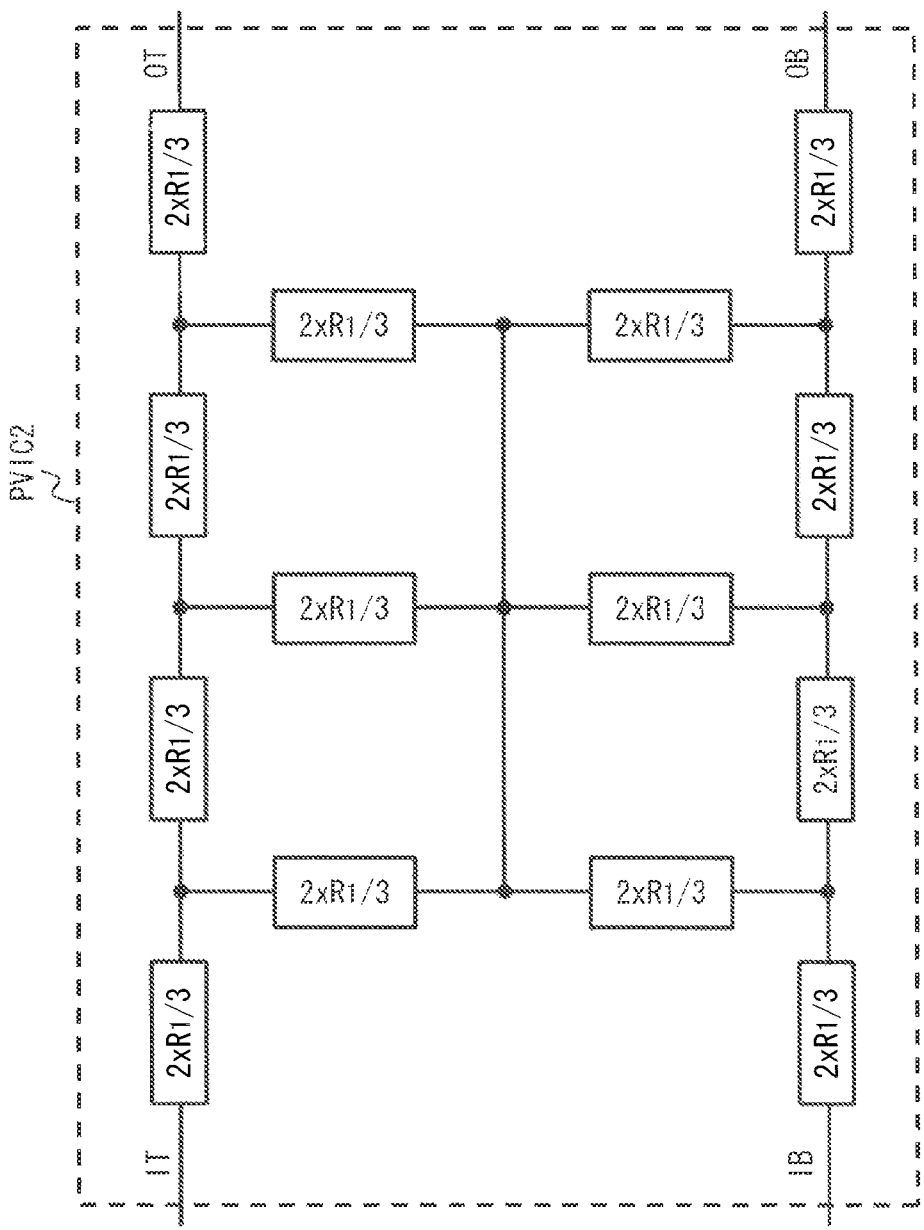
FIG. 16 is a diagram showing an equivalent circuit of the programmable voltage-to-current converter PVIC2 according to the second embodiment.

FIG. 16 is an equivalent circuit of FIG. 15. Referring to FIG. 16, in the state D, the output current Iin2 of the programmable voltage-to-current converter PVIC2 is represented by the following equation (38) when the current flowing from the programmable voltage-to-current converter PVIC2 toward the operational amplifier OPA is a positive current.

$$Iin2 = I_{OT} - I_{OB} = (V_{INT} - V_{INB})/(8R_1) \quad \text{Equation (38)}$$

Thus, the voltage gain G2 of the inverting amplification circuit 2 in the state D is represented by the following equation (39).

$$G2 = (V_{OUTT} - V_{OUTB})/(V_{INT} - V_{INB}) \quad \text{Equation (39)}$$
$$= -Iin2 \times R_2 / (V_{INT} - V_{INB})$$
$$= -R_2/(8R_1)$$

In other words, the voltage gain G2 of the inverting amplification circuit 2 in the state D is 20×log 10(|G2|/8)dB. Thus, the voltage gain G2 of the inverting amplification circuit 2 in the state D is attenuated by about 18 dB from the voltage gain G10 of the inverting amplification circuit 10.

As described above, the programmable voltage-to-current converter PVIC2 according to this embodiment sets a current path through which a current with the desired voltage-to-current conversion gain gm2 flows and also sets an alternative path (the path of the node N41) through which a current that is no longer needed based on the voltage-to-current conversion gain gm2 detours by switching the conducting state of each of a plurality of switching elements in a programmable manner. The inverting amplification circuit 2 according to this embodiment can thereby keep the combined resistances RtotalI and RtotalO constant even when the conducting state of each of the plurality of switching elements provided in the programmable voltage-to-current converter PVIC2 has changed.

Accordingly, in the inverting amplification circuit 2 according to this embodiment, the problem that the frequency characteristics of the amplification result Vout varies unintentionally due to the phase rotation of a feedback signal does not occur. Further, in the inverting amplification circuit 2 according to this embodiment, the problem that the voltage gain of an amplifier circuit in the previous stage (not shown) varies unintentionally does not occur because the resistance as seen from the amplifier circuit in the previous stage does not change. The inverting amplification circuit 2 according to this embodiment can thereby output the accurate amplification result Vout.

Further, in the programmable voltage-to-current converter PVIC2 according to this embodiment, a voltage applied to the switching elements in the off-state (open) is lower compared with the case of the programmable voltage-to-current converter PVIC1. The switching elements are formed using FET such as MOSFET or JFET, for example Therefore, as the semiconductor process becomes finer, a leakage current is likely to flow into the switching elements in the off-state. In view of this, the programmable voltage-to-current converter PVIC2 according to this embodiment reduces a voltage applied to the switching elements in the off-state to thereby suppress a leakage current that flows through the switching elements in the off-state. The programmable voltage-to-current converter PVIC2 according to this embodiment can thereby perform voltage-to-current conversion more accurately. Differences between the programmable voltage-to-current converter PVIC1 and the programmable voltage-to-current converter PVIC2 are briefly described below.

<Differences between Programmable Voltage-to-Current Converters PVIC1 and PVIC2>

First, in the programmable voltage-to-current converter PVIC1 (see FIG. 4), because the output terminals OT and OB are virtually short-circuited, a specified bias voltage level is indicated. For example, when a large input voltage Vin is supplied to the input terminals IT and IB, a large voltage is applied between the both terminals of the switching elements in the off-state. There is thus a possibility that a leakage current flows to the switching elements in the off-state.

On the other hand, in the programmable voltage-to-current converter PVIC2 (see FIG. 7), even when a large input voltage Vin is supplied to the input terminals IT and IB, the input voltage Vin is divided by the resistance attenuators ATT1T to ATT3T and the resistance attenuators ATT1B to ATT3B and therefore a voltage applied between the both terminals of the switching elements in the off-state is small. A leakage current that flows through the switching elements in the off-state is thereby suppressed. This is described with reference to specific examples.

Figure 17:
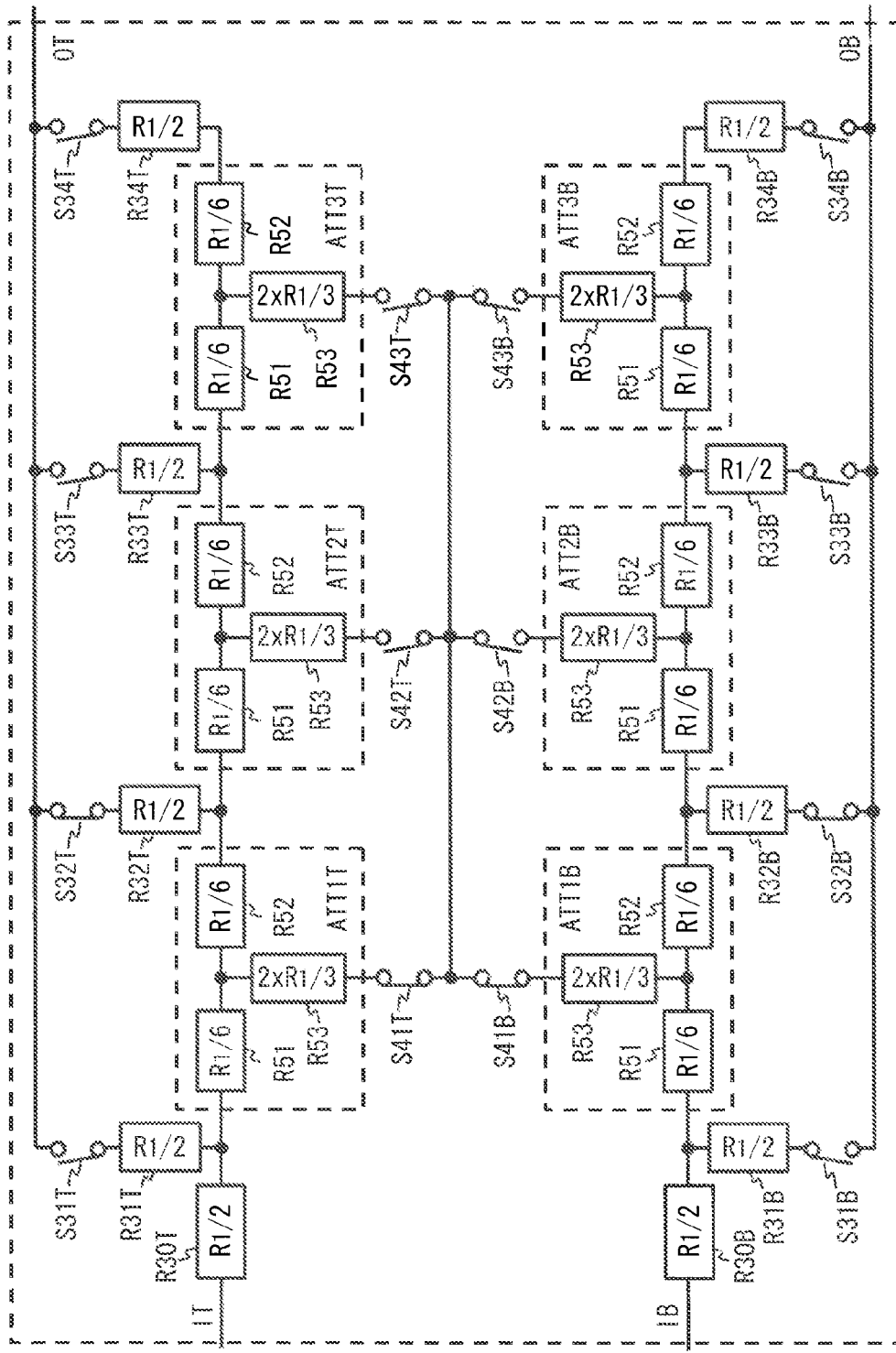
FIG. 17 is a diagram illustrating effects of the programmable voltage-to-current converter PVIC2 according to the second embodiment.

FIG. 17 is a diagram showing a configuration of the programmable voltage-to-current converter PVIC2 in the state B. As shown in FIG. 17, the switching elements in the off-state (open) are the switching elements S31T, S31B, S33T, S33B, S34T, S34B, S42T, S42B, S43T and S43B. Even when a large input voltage Vin is supplied to the input terminals IT and IB, the input voltage Vin is divided by the resistor elements arranged in a mesh and therefore a voltage applied between the both terminals of the switching elements in the off-state is small. A leakage current that flows through the switching elements in the off-state is thereby suppressed. The same applies to the cases of the states A, C and D.

Although the case where the inverting amplification circuit 2 selectively sets one of four voltage gains that differ by 6 dB each is described by way of illustration in this embodiment, it is not limited thereto. The inverting amplification circuit 2 may be altered to the configuration that selectively sets any number and any value of voltage gains.

Further, although the case where the resistance attenuators ATT1T to ATT3T and ATT1B to ATT3B are all T-type resistance attenuators shown in FIG. 8 is described by way of illustration in this embodiment, it is not limited thereto. The same advantageous effects can be obtained when the resistance attenuators ATT1T to ATT3T and ATT1B to ATT3B are π-type resistance attenuators shown in FIG. 9.

Third Embodiment

Figure 18:
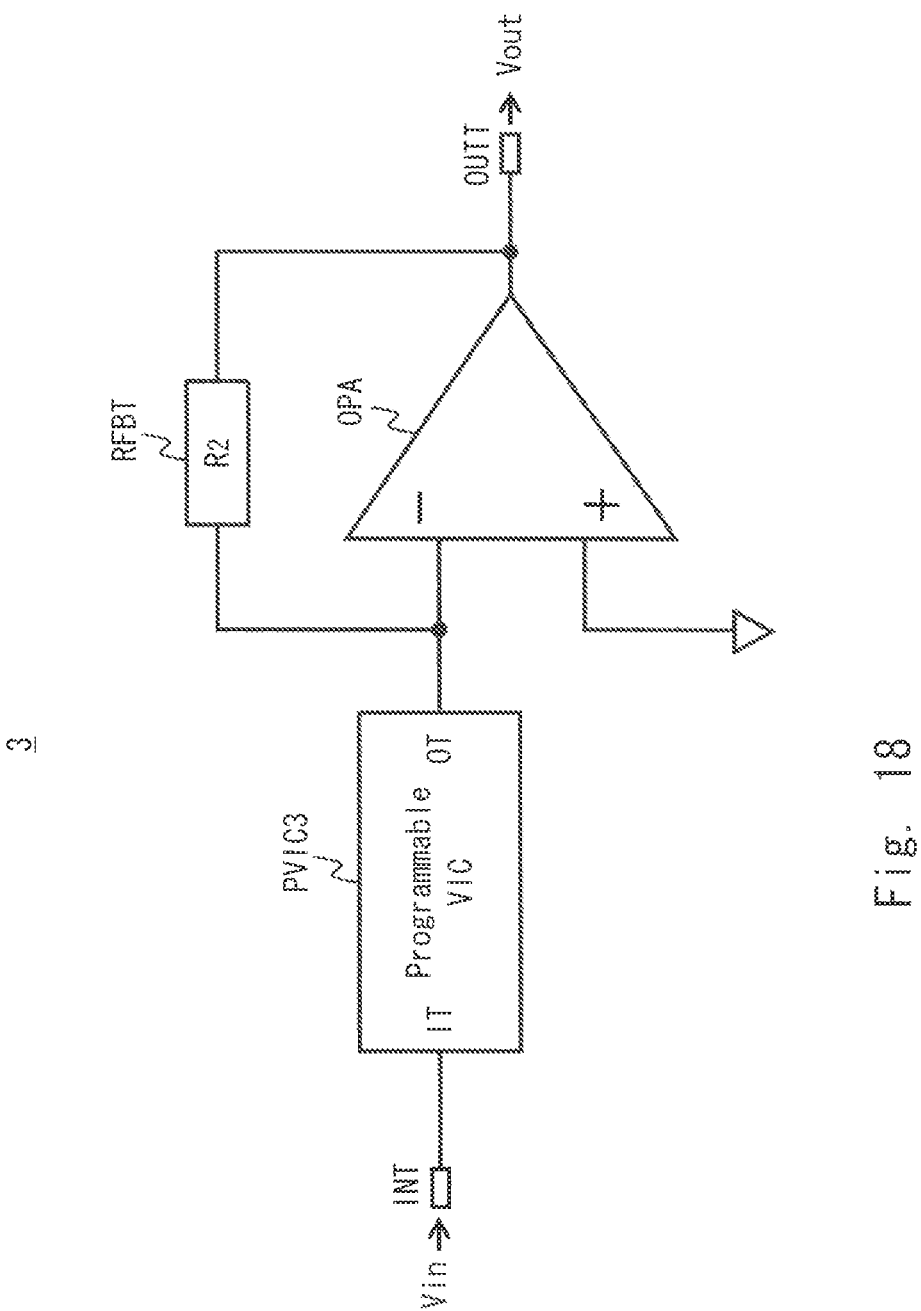
FIG. 18 is a block diagram showing a configuration example of an inverting amplification circuit according to a third embodiment.

FIG. 18 is a diagram showing a configuration example of an inverting amplification circuit (semiconductor integrated circuit) 3 according to a third embodiment. The inverting amplification circuit 1 shown in FIG. 3 is a fully differential inverting amplification circuit. On the other hand, the inverting amplification circuit 3 shown in FIG. 18 is a single end inverting amplification circuit. This is described specifically below. The inverting amplification circuit 3 shown in FIG. 18 is applied to the RF subsystem 603 in the radio communication terminal 500 shown in FIG. 2, for example.

The inverting amplification circuit 3 shown in FIG. 18 includes an operational amplifier (amplification circuit) OPA, a feedback resistor RFBT, and a programmable voltage-to-current converter (variable resistor unit) PVIC3. Note that the components of the inverting amplification circuit 3 shown in FIG. 18 which are the same as those of the inverting amplification circuit shown in FIG. 3 are denoted by the same reference numerals and not redundantly described.

The input terminal IT of the voltage-to-current converter PVIC3 is connected to an input terminal (eternal input terminal) INT of the inverting amplification circuit 3. The output terminal OT of the voltage-to-current converter PVIC3 is connected to the inverting input terminal of the operational amplifier OPA. The non-inverting input terminal of the operational amplifier OPA is connected to a ground voltage terminal (reference voltage terminal) GND to which a ground voltage (reference voltage) is supplied. The output terminal of the operational amplifier OPA is connected to the output terminal OUTT of the inverting amplification circuit 3. The feedback resistor RFBT is placed between the output terminal and the inverting input terminal of the operational amplifier OPA.

Figure 19:
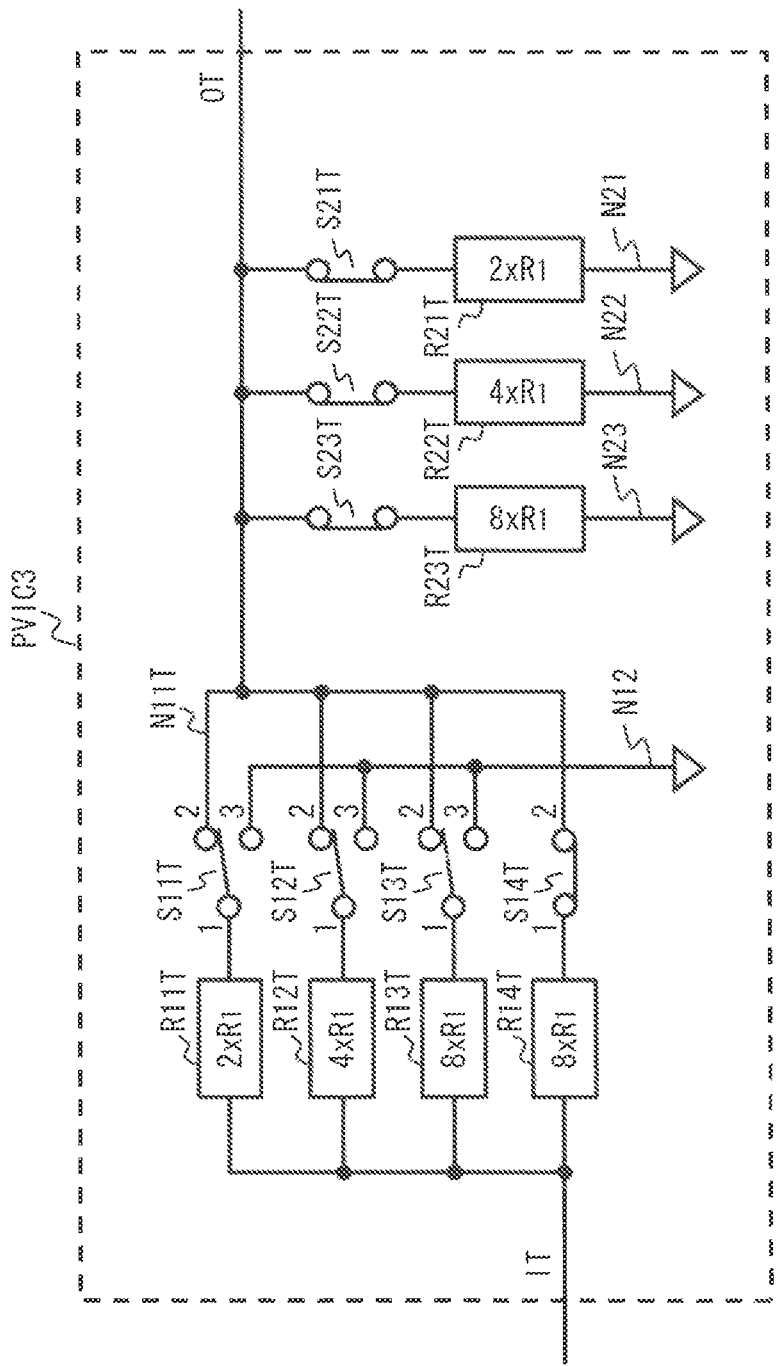
FIG. 19 is a circuit diagram showing a configuration example of a programmable voltage-to-current converter PVIC3 according to the third embodiment.

FIG. 19 is a circuit, diagram showing a specific configuration example of the programmable voltage-to-current converter PVIC3. The programmable voltage-to-current converter PVIC3 includes resistor elements (first resistor elements) R11T to R14T, resistor elements (second resistor elements) R21T to R23T, switching elements (first switching elements) S11T to S14T, and switching elements (second switching elements) S21T to S23T. Thus, the programmable voltage-to-current converter PVIC3 only includes a plurality of resistor elements and a plurality of switching elements that are provided on the True side of the programmable voltage-to-current converter PVIC1.

The components of the programmable voltage-to-current converter PVIC3 shown in FIG. 19 which are the same as those of the programmable voltage-to-current converter PVIC1 shown in FIG. 4 are denoted by the same reference numerals and not redundantly described. Note that nodes N12 and N21 to N23 are connected to the ground voltage terminal GND.

The programmable voltage-to-current converter PVIC3 controls the conducting state of each of the switching elements S11T to S14T and the switching elements S21T to S23T based on a control signal from a control circuit (not shown) and thereby controls the combined resistance between the input terminal IT and the output terminal OT in a programmable manner. The inverting amplification circuit 3 can thereby amplify the input voltage Vin with a desired voltage gain and output the amplification result (amplified signal) Vout.

A specific operation of the programmable voltage-to-current converter PVIC3 is the same as the operation of the programmable voltage-to-current converter PVIC1 on the True side and therefore not redundantly described.

As described above, the programmable voltage-to-current converter PVIC3 according to this embodiment sets a current path through which a current with a desired voltage-to-current conversion gain flows and also sets an alternative path (the path of the node N12 and the paths of the nodes N21 to N23) through which a current that is no longer needed based on the voltage-to-current conversion gain detours by switching the conducting state of each of a plurality of switching elements in a programmable manner. The inverting amplification circuit 3 according to this embodiment can thereby keep the combined resistances RtotalI and RtotalO constant even when the conducting state of each of the plurality of switching elements provided in the programmable voltage-to-current converter PVIC3 has changed.

Accordingly, in the inverting amplification circuit 3 according to this embodiment, the problem that the frequency characteristics of the amplification result Vout varies unintentionally due to the phase rotation of a feedback signal does not occur. Further, in the inverting amplification circuit 3 according to this embodiment, the problem that the voltage gain of an amplifier circuit in the previous stage (not shown) varies unintentionally does not occur because the resistance as seen from the amplifier circuit in the previous stage does not change. The inverting amplification circuit 3 according to this embodiment can thereby output the accurate amplification result Vout.

Note that, although the case where the programmable voltage-to-current converter PVIC3 has the alternative path (first alternative path) of the current flowing through the nodes N21 to N23 and the alternative path (second alternative path) of the current flowing through the node N12 is described by way of illustration in this embodiment, it is not limited thereto. The programmable voltage-to-current converter PVIC3 may be altered to the configuration having at least one of the first and second alternative paths. For example, the configuration having only the first alternative path can suppress the unintentional variation of the frequency characteristics of the amplification result Vout due to the phase rotation of a feedback signal. On the other hand, the configuration having only the second alternative path can suppress the unintentional variation of the voltage gain of the amplifier circuit in the previous stage.

Fourth Embodiment

Figure 20:
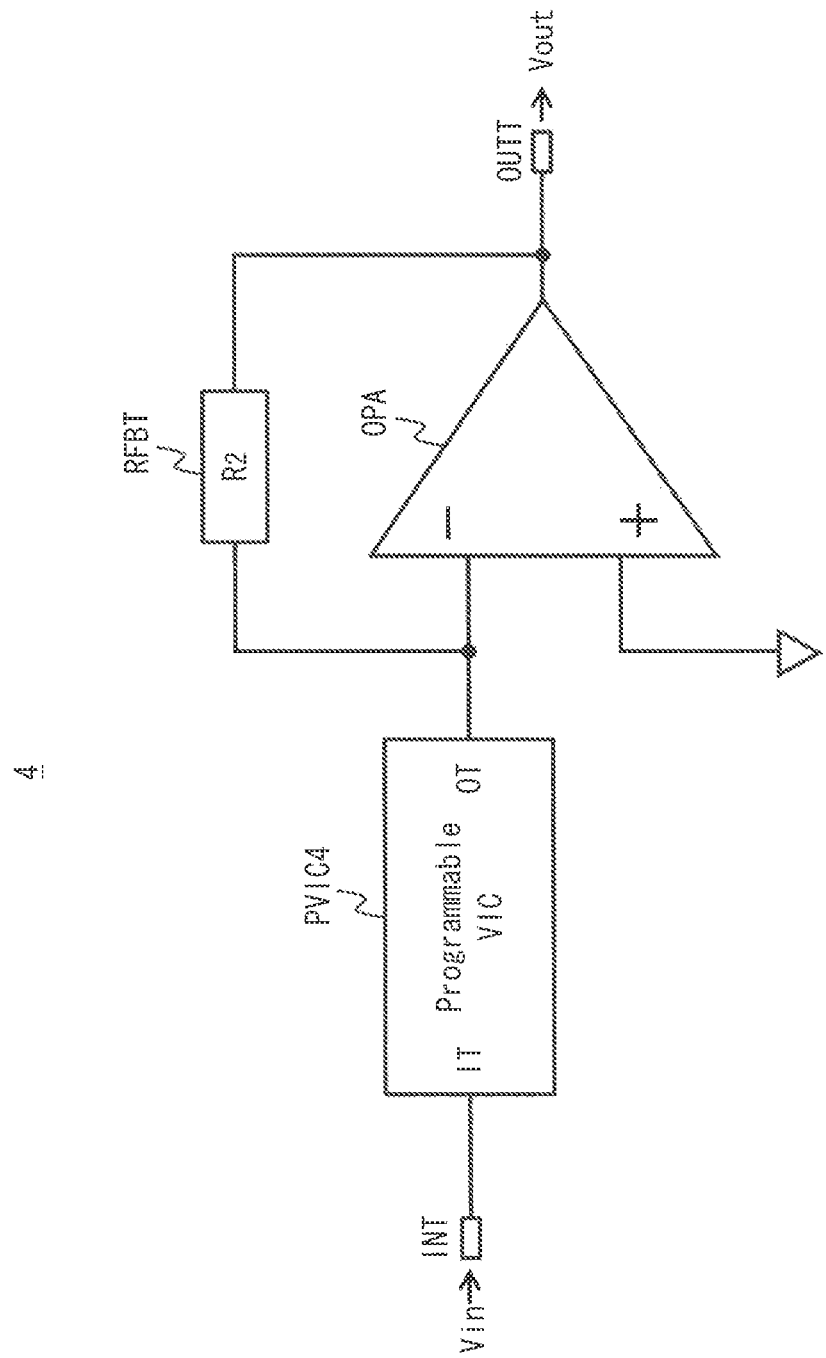
FIG. 20 is a block diagram showing a configuration example of an inverting amplification circuit according to a fourth embodiment.

FIG. 20 is a diagram showing a configuration example of an inverting amplification circuit (semiconductor integrated circuit) 4 according to a fourth embodiment. The inverting amplification circuit 4 shown in FIG. 20 is different from the inverting amplification circuit 3 shown in FIG. 18 in the configuration of the programmable voltage-to-current converter. This is described specifically below. Note that the inverting amplification circuit 4 shown in FIG. 20 is applied to the RF subsystem 603 in the radio communication terminal 500 shown in FIG. 2, for example.

The inverting amplification circuit 4 shown in FIG. 20 includes an operational amplifier (amplification circuit) OPA, a feedback resistor RFBT, and a programmable voltage-to-current converter (variable resistor unit) PVIC4. The components other than the programmable voltage-to-current converter PVIC4 are the same as those of the inverting amplification circuit 3 shown in FIG. 18 and not redundantly described.

Figure 21:
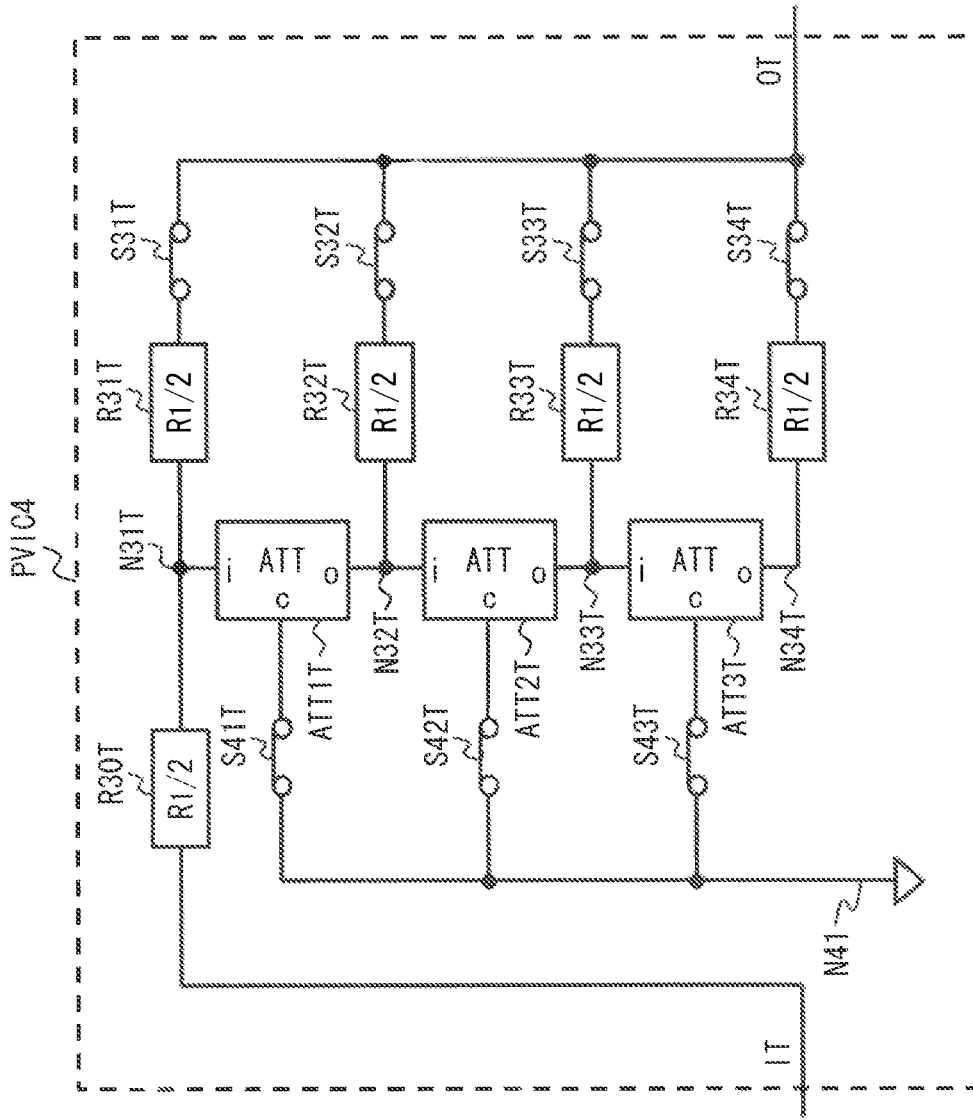
FIG. 21 is a circuit diagram showing a configuration example of a programmable voltage-to-current converter PVIC4 according to the fourth embodiment.

FIG. 21 is a circuit diagram showing a specific configuration example of the programmable voltage-to-current converter PVIC4. The programmable voltage-to-current converter PVIC4 includes resistor elements (first resistor elements) R30T to R34T, switching elements (first switching elements) S31T to S34T, switching elements (second switching elements) S41T to S43T, and resistance attenuators ATT1T to ATT3T. Thus, the programmable voltage-to-current converter PVIC4 only includes a plurality of resistor elements and a plurality of switching elements that are provided on the True side of the programmable voltage-to-current converter PVIC2.

The components of the programmable voltage-to-current converter PVIC4 shown in FIG. 21 which are the same as those of the programmable voltage-to-current converter PVIC2 shown in FIG. 7 are denoted by the same reference numerals and not redundantly described. Note that a node N41 is connected to the ground voltage terminal GND.

The programmable voltage-to-current converter PVIC4 controls the conducting state of each of the switching elements S31T to S34T and S41T to S43T based on a control signal from a control circuit (not shown) and thereby controls the combined resistance between the input terminal IT and the output terminal OT in a programmable manner. The inverting amplification circuit 4 can thereby amplify the input voltage Vin with a desired voltage gain and output the amplification result (amplified signal) Vout.

A specific operation of the programmable voltage-to-current converter PVIC4 is the same as the operation of the programmable voltage-to-current converter PVIC2 on the True side and therefore not redundantly described.

As described above, the programmable voltage-to-current converter PVIC4 according to this embodiment sets a current path through which a current with a desired voltage-to-current conversion gain flows and also sets an alternative path (the path of the node N41) through which a current that is no longer needed based on the voltage-to-current conversion gain detours by switching the conducting state of each of a plurality of switching elements in a programmable manner. The inverting amplification circuit 4 according to this embodiment can thereby keep the combined resistances RtotalI and RtotalO constant even when the conducting state of each of the plurality of switching elements provided in the programmable voltage-to-current converter PVIC4 has changed.

Accordingly, in the inverting amplification circuit 4 according to this embodiment, the problem that the frequency characteristics of the amplification result Vout varies unintentionally due to the phase rotation of a feedback signal does not occur. Further, in the inverting amplification circuit 4 according to this embodiment, the problem that the voltage gain of an amplifier circuit in the previous stage (not shown) varies unintentionally does not occur because the resistance as seen from the amplifier circuit in the previous stage does not change. The inverting amplification circuit 4 according to this embodiment can thereby output the accurate amplification result Vout.

Further, in the programmable voltage-to-current converter PVIC4 according to this embodiment, a voltage applied to the switching elements in the off-state (open) is lower compared with the case of the programmable voltage-to-current converter PVIC3. The switching elements are formed using FET such as MOSFET or JFET, for example. Therefore, as the semiconductor process becomes finer, a leakage current is likely to flow into the switching elements in the off-state. In view of this, the programmable voltage-to-current converter PVIC4 according to this embodiment reduces a voltage applied to the switching elements in the off-state to thereby suppress a leakage current that flows through the switching elements in the off-state. The programmable voltage-to-current converter PVIC4 according to this embodiment can thereby perform voltage-to-current conversion more accurately.

As described above, the programmable voltage-to-current converter according to the first to fourth embodiments sets a current path through which a current with a desired voltage-to-current conversion gain flows and also sets an alternative path through which a current that is no longer needed based on the voltage-to-current conversion gain detours by switching the conducting state of each of a plurality of switching elements in a programmable manner. The inverting amplification circuit according to the first to fourth embodiments can thereby keep the input/output impedance (the combined resistance RtotalI, RtotalO) constant even when the conducting state of each of the plurality of switching elements provided in the programmable voltage-to-current converter has changed.

Accordingly, in the inverting amplification circuit according to the first to fourth embodiments, the problem that the frequency characteristics of the amplification result Vout varies unintentionally due to the phase rotation of a feedback signal does not occur. Further, in the inverting amplification circuit according to the first to fourth embodiments, the problem that the voltage gain of an amplifier circuit in the previous stage (not shown) varies unintentionally does not occur because the resistance as seen from the amplifier circuit in the previous stage does not change. The inverting amplification circuit according to the first to fourth embodiments can thereby output the accurate amplification result Vout.

Although the case where the input/output impedance (the combined resistance RtotalI, RtotalO) of the programmable voltage-to-current converter is constant all the time is described by way of illustration in the above embodiments, it is not limited thereto as long as variation of the input/output impedance of the programmable voltage-to-current converter can be suppressed by making a current that is no longer needed based on the voltage-to-current conversion gain detour.

<Differences from Cited Literatures>

In the configuration disclosed in H.-H. Nguyen et al, "84 dB 5.2 mA digitally-controlled variable gain amplifier", Electronics Letters, 2008, Vol. 44, No. 5, pp. 344-345, the configuration of the feedback resistor part is different from that of the inverting amplification circuit 20 shown in FIG. 23. To be more specific, in the configuration disclosed therein, the resistance of the feedback resistor can be set in a programmable manner. However, the same problems as in the inverting amplification circuit 20 shown in FIG. 23 occur also in the configuration disclosed therein. On the other hand, those problems do not occur in the inverting amplification circuits 1 to 4 according to the above embodiments as described in the foregoing.

Note that, in the feedback resistor part of the inverting amplification circuit, capacitor elements and the like are also provided in general in order to form a channel filter. Thus, in the configuration disclosed in H.-H. Nguyen et al, "84 dB 5.2 mA digitally-controlled variable gain amplifier", Electronics Letters, 2008, Vol. 44, No. 5, pp. 344-345, the circuit size increases.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit comprising:
an operational amplifier that amplifies a voltage difference between an input voltage supplied to an inverting input terminal and a reference voltage supplied to a non-inverting input terminal and outputs an amplified signal;
a feedback resistor that performs negative feedback of the amplified signal to the inverting input terminal of the operational amplifier; and
a variable resistor unit that sets a current path with a first resistance value in accordance with a control signal between an external input terminal and the inverting input terminal of the operational amplifier, and sets a first alternative path with a second resistance value in accordance with the control signal between a node on the current path and a reference voltage terminal to which the reference voltage is supplied,
wherein the variable resistor unit includes:
a plurality of first resistor elements placed in parallel between the external input terminal and the inverting input terminal of the operational amplifier,
a plurality of first switching elements respectively placed between one ends of the plurality of first resistor elements and the inverting input terminal of the operational amplifier and having a conducting state controlled based on the control signal, a plurality of resistance attenuators respectively placed between other ends of the plurality of first resistor elements, and a plurality of second switching elements respectively placed between common terminals of the plurality of resistance attenuators and the reference voltage terminal and having a conducting state controlled based on the control signal.

2. The semiconductor integrated circuit according to claim 1, wherein the variable resistor unit sets the first alternative path between the inverting input terminal of the operational amplifier and the reference voltage terminal.

3. The semiconductor integrated circuit according to claim 2, wherein the variable resistor unit sets the current path and the first alternative path in such a way that impedance of the variable resistor unit as seen from the operational amplifier is constant regardless of a state of the control signal.

4. The semiconductor integrated circuit according to claim 2, wherein the variable resistor unit further sets a second alternative path with the second resistance value in accordance with the control signal between the external input terminal and the reference voltage terminal.

5. The semiconductor integrated circuit according to claim 4, wherein the variable resistor unit sets the current path, the first alternative path and the second alternative path in such a way that impedance of the variable resistor unit as seen from the operational amplifier is constant regardless of a state of the control signal and that impedance of the variable resistor unit as seen from the external input terminal is constant regardless of a state of the control signal.

6. The semiconductor integrated circuit according to claim 1, wherein the variable resistor unit sets the first alternative path between the external input terminal and the reference voltage terminal.

7. A semiconductor integrated circuit comprising:
an operational amplifier;
a first feedback resistor that performs negative feedback of one of differential output signals of the operational amplifier;
a second feedback resistor that performs negative feedback of another one of differential output signals of the operational amplifier; and
a variable resistor unit that sets first and second current paths with a first resistance value in accordance with a control signal between a first external input terminal and an inverting input terminal of the operational amplifier and between a second external input terminal and a non-inverting input terminal of the operational amplifier, respectively, and sets a first alternative path with a second resistance value in accordance with the control signal between nodes on the first and second current paths,
wherein the variable resistor unit includes:
a plurality of first resistor elements placed in parallel between the first external input terminal and the inverting input terminal of the operational amplifier,
a plurality of second resistor elements placed in parallel between the second external input terminal and the non-inverting input terminal of the operational amplifier,
a plurality of first switching elements respectively placed between one ends of the plurality of first resistor elements and the inverting input terminal of the operational amplifier and having a conducting state controlled based on the control signal, a plurality of second switching elements respectively placed between one ends of the plurality of second resistor elements and the non-inverting input terminal of the operational amplifier and having a conducting state controlled based on the control signal, a plurality of first resistance attenuators respectively placed between other ends of the plurality of first resistor elements, a plurality of second resistance attenuators respectively placed between other ends of the plurality of second resistor elements, a plurality of third switching elements respectively placed between common terminals of the plurality of first resistance attenuators and a common node and having a conducting state controlled based on the control signal, and a plurality of fourth switching elements respectively placed between common terminals of the plurality of second resistance attenuators and the common node and having a conducting state controlled based on the control signal.

8. The semiconductor integrated circuit according to claim 7, wherein the variable resistor unit sets the first alternative path between the inverting input terminal and the non-inverting input terminal of the operational amplifier.

9. The semiconductor integrated circuit according to claim 8, wherein the variable resistor unit sets the first current path, the second current path and the first alternative path in such a way that impedance of the variable resistor unit as seen from the operational amplifier is constant regardless of a state of the control signal.

10. The semiconductor integrated circuit according to claim 8, wherein the variable resistor unit further sets a second alternative path with the second resistance value in accordance with the control signal between the first and second external input terminals.

11. The semiconductor integrated circuit according to claim 10, wherein the variable resistor unit sets the first current path, the second current path, the first alternative path and the second alternative path in such a way that impedance of the variable resistor unit as seen from the operational amplifier is constant regardless of a state of the control signal and that impedance of the variable resistor unit as seen from the first and second external input terminals is constant regardless of a state of the control signal.

12. The semiconductor integrated circuit according to claim 7, wherein the variable resistor unit sets the first alternative path between the first and second external input terminals.

13. A radio communication terminal comprising a semiconductor integrated circuit according to claim 1.

14. A radio communication terminal comprising a semiconductor integrated circuit according to claim 7.

15. A semiconductor integrated circuit comprising:
an operational amplifier that amplifies a voltage difference between an input voltage supplied to an inverting input terminal and a reference voltage supplied to a non-inverting input terminal and outputs an amplified signal;
a feedback resistor that performs negative feedback of the amplified signal to the inverting input terminal of the operational amplifier; and
a variable resistor unit that sets a current path with a first resistance value in accordance with a control signal between an external input terminal and the inverting input terminal of the operational amplifier, and sets a first alternative path with a second resistance value in accordance with the control signal between a node on the current path and a reference voltage terminal to which the reference voltage is supplied, wherein the variable resistor unit includes:
- a plurality of first resistor elements placed in parallel between the external input terminal and the inverting input terminal of the operational amplifier,
- a plurality of first switching elements respectively placed between the plurality of first resistor elements and the inverting input terminal of the operational amplifier and having a conducting state controlled based on the control signal,
- a plurality of second resistor elements placed in parallel between the inverting input terminal of the operational amplifier and the reference voltage terminal, and
- a plurality of second switching elements respectively connected in series with the plurality of second resistor elements and having a conducting state controlled based on the control signal, and wherein the plurality of first switching elements connect each of the plurality of first resistor elements to one of the inverting input terminal of the operational amplifier and the reference voltage terminal based on the control signal.

16. The semiconductor integrated circuit according to claim 15, wherein the variable resistor unit sets the first alternative path between the inverting input terminal of the operational amplifier and the reference voltage terminal, and wherein the variable resistor unit further sets a second alternative path with the second resistance value in accordance with the control signal between the external input terminal and the reference voltage terminal.

17. The semiconductor integrated circuit according to claim 16, wherein the variable resistor unit sets the current path, the first alternative path and the second alternative path in such a way that impedance of the variable resistor unit as seen from the operational amplifier is constant regardless of a state of the control signal and that impedance of the variable resistor unit as seen from the external input terminal is constant regardless of a state of the control signal.

18. The semiconductor integrated circuit according to claim 15, wherein the variable resistor unit sets the first alternative path between the external input terminal and the reference voltage terminal.

19. A radio communication terminal comprising a semiconductor integrated circuit according to claim 15.

* * * * *